United States Patent
Billiet et al.

(10) Patent No.: US 11,813,838 B2
(45) Date of Patent: *Nov. 14, 2023

(54) LITHOGRAPHIC PRINTING PLATE PRECURSOR

(71) Applicant: AGFA OFFSET BV, Mortsel (BE)

(72) Inventors: Thomas Billiet, Mortsel (BE); Eva Vermeiren, Mortsel (BE)

(73) Assignee: Agfa Offset BV, Mortsel (BE)

( * ) Notice: Subject to any disclaimer, the term of this patent is extended or adjusted under 35 U.S.C. 154(b) by 66 days.

This patent is subject to a terminal disclaimer.

(21) Appl. No.: 17/055,158

(22) PCT Filed: May 13, 2019

(86) PCT No.: PCT/EP2019/062131
§ 371 (c)(1),
(2) Date: Nov. 13, 2020

(87) PCT Pub. No.: WO2019/219560
PCT Pub. Date: Nov. 21, 2019

(65) Prior Publication Data
US 2021/0187935 A1    Jun. 24, 2021

(30) Foreign Application Priority Data
May 14, 2018   (EP) .................... 18172060

(51) Int. Cl.
*B41C 1/10*   (2006.01)
*G03F 7/11*   (2006.01)
*B41N 1/14*   (2006.01)

(52) U.S. Cl.
CPC .............. *B41C 1/1016* (2013.01); *B41N 1/14* (2013.01); *G03F 7/11* (2013.01); *B41C 2201/02* (2013.01); *B41C 2201/12* (2013.01); *B41C 2210/04* (2013.01); *B41C 2210/08* (2013.01); *B41C 2210/22* (2013.01)

(58) Field of Classification Search
CPC ..................................................... B41N 1/14
See application file for complete search history.

(56) References Cited

U.S. PATENT DOCUMENTS

| 7,402,374 B2 | 7/2008 | Oohashi et al. | |
| 7,425,406 B2 | 9/2008 | Oshima et al. | |
| 7,462,440 B2 | 12/2008 | Yamasaki | |
| 2008/0311524 A1* | 12/2008 | Vermeersch | B41C 1/1025 427/144 |
| 2016/0263930 A1* | 9/2016 | Lenaerts | B41N 1/083 |

FOREIGN PATENT DOCUMENTS

| EP | 0419095 A2 | 3/1991 | |
| EP | 0897134 A2 | 2/1999 | |
| EP | 0925916 A1 | 6/1999 | |
| EP | 1300241 A2 | 4/2003 | |
| EP | 1495866 A2 * | 1/2005 | ......... B41C 1/1016 |
| EP | 1502736 A2 | 2/2005 | |
| EP | 1614541 A2 * | 1/2006 | ......... B41C 1/1008 |
| EP | 1614541 A2 | 1/2006 | |
| EP | 1619023 B1 | 6/2008 | |
| EP | 3184590 A1 * | 6/2017 | ......... B41C 1/1016 |
| EP | 3184590 A1 | 6/2017 | |
| WO | 9635143 A1 | 11/1996 | |
| WO | 2006005688 A1 | 7/2005 | |
| WO | 2006136543 A2 | 12/2006 | |
| WO | 2009080689 A1 | 7/2009 | |
| WO | 2015055409 A1 | 4/2015 | |

OTHER PUBLICATIONS

International Search Report dated Aug. 8, 2019 relating to PCT/EP2019/062131, 4 pages.
Written Opinion dated Aug. 8, 2019 relating to PCT/EP2019/062131, 7 pages.

\* cited by examiner

*Primary Examiner* — Chanceity N Robinson
(74) *Attorney, Agent, or Firm* — Leydig, Voit & Mayer, Ltd.

(57) ABSTRACT

A lithographic printing plate precursor is disclosed including a support and a coating comprising (i) a photopolymerisable layer including a polymerisable compound and a photoinitiator, and a toplayer provided above the photopolymerisable layer; characterized in that the toplayer has a thickness comprised between 0.1 g/m$^2$ and 1.75 g/m$^2$ and includes an infrared absorbing compound which includes a thermocleavable group which transforms into a group which is a stronger electrondonor upon exposure to heat and/or IR radiation, and is capable of forming a printout image upon exposure to heat and/or IR radiation.

15 Claims, No Drawings

LITHOGRAPHIC PRINTING PLATE PRECURSOR

REFERENCE TO RELATED APPLICATIONS

This application is a 371 National Stage Application of PCT/EP2019/062131, filed May 13, 2019, which claims the benefit of European Application No. 18172060.8, filed May 14, 2018, the contents of which are incorporated by reference herein in their entirety.

TECHNICAL FIELD

The invention relates to a novel lithographic printing plate precursor.

BACKGROUND ART

Lithographic printing typically involves the use of a so-called printing master such as a printing plate which is mounted on a cylinder of a rotary printing press. The master carries a lithographic image on its surface and a print is obtained by applying ink to said image and then transferring the ink from the master onto a receiver material, which is typically paper. In conventional lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-abhesive (ink-repelling) areas and during driographic printing, only ink is supplied to the master.

Lithographic printing masters are generally obtained by the image-wise exposure and processing of a radiation sensitive layer on a lithographic support. Imaging and processing renders the so-called lithographic printing plate precursor into a printing plate or master. Image-wise exposure of the radiation sensitive coating to heat or light, typically by means of a digitally modulated exposure device such as a laser, triggers a physical and/or chemical process, such as ablation, polymerization, insolubilization by cross-linking of a polymer or by particle coagulation of a thermoplastic polymer latex, solubilization by the destruction of intermolecular interactions or by increasing the penetrability of a development barrier layer. Although some plate precursors are capable of producing a lithographic image immediately after exposure, the most popular lithographic plate precursors require wet processing since the exposure produces a difference in solubility or difference in rate of dissolution in a developer between the exposed and the non-exposed areas of the coating. In positive working lithographic plate precursors, the exposed areas of the coating dissolve in the developer while the non-exposed areas remain resistant to the developer. In negative working lithographic plate precursors, the non-exposed areas of the coating dissolve in the developer while the exposed areas remain resistant to the developer. Most lithographic plate precursors contain a hydrophobic coating on a hydrophilic support, so that the areas which remain resistant to the developer define the ink-accepting, hence printing areas of the plate while the hydrophilic support is revealed by the dissolution of the coating in the developer at the non-printing areas.

Photopolymer printing plates rely on a working-mechanism whereby the coating—which typically includes free radically polymerisable compounds—hardens upon exposure. "Hardens" means that the coating becomes insoluble or non-dispersible in the developing solution and may be achieved through polymerization and/or crosslinking of the photosensitive coating upon exposure to light and/or heat. Photopolymer plate precursors can be sensitized to blue, green or red light i.e. wavelengths ranging between 450 and 750 nm, to violet light i.e. wavelengths ranging between 300 and 450 nm or to infrared light i.e. wavelengths ranging between 750 and 1500 nm. Optionally, the exposure step is followed by a heating step to enhance or to speed-up the polymerization and/or crosslinking reaction.

In general, a toplayer or protective overcoat layer over the imageable layer is required to act as an oxygen barrier to provide the desired sensitivity to the plate. A toplayer typically includes water-soluble or water-swellable polymers such as for example polyvinylalcohol. Besides acting as barrier for oxygen, the toplayer should best be easily removable during processing and be sufficiently transparent for actinic radiation, e.g. from 300 to 450 nm or from 450 to 750 nm or from 750 to 1500 nm.

The classical workflow of photopolymer plates involves first an exposure step of the photopolymer printing plate precursor in a violet or infrared platesetter, followed by an optional pre-heat step, a wash step of the protective overcoat layer, an alkaline developing step, and a rinse and gum step. However, there is a clear evolution in the direction of a simplified workflow where the pre-heat step and/or wash step are eliminated and where the processing and gumming step are carried out in one single step or where processing is carried out with a neutral gum and then gummed in a second step. Alternatively, on-press processing wherein the plate is mounted on the press and the coating layer is developed by interaction with the fountain and/or ink that are supplied to the plate during the press run, has become very popular. During the first runs of the press, the non-image areas are removed from the support and thereby define the non-printing areas of the plate.

In order to be able to evaluate the lithographic printing plates for image quality, such as for example image resolution and detail rendering (usually measured with an optical densitometer) before mounting them on the press, the lithographic printing plate precursors often contain a colorant such as a dye or a pigment in the coating. Such colorants provide, after processing, a contrast between the image areas containing the colorant and the hydrophilic support where the coating has been removed which enables the end-user to evaluate the image quality and/or to establish whether or not the precursor has been exposed to light. Furthermore, besides allowing for the evaluation of the image quality, a high contrast between the image and the hydrophilic support is required in order to obtain a good image registration (alignment) of the different printing plates in multi-colour printing in order to ensure image sharpness (resolution) and a correct rendering of the colours in the images present.

However, for photopolymer lithographic printing plates which are processed on-press and thus development of the plate is not carried out before mounting the plate on the press, a previous inspection and discrimination of the plate including colorants is not possible. A solution has been provided in the art by including components to the coating which are able to form upon exposure a so-called "print-out image", i.e. an image which is visible before processing. In these materials however, often the photo-initiating system is a reacting component, which induces formation of the print-out image upon exposure, and therefore the lithographic differentiation may be reduced.

Formation of a print-out image for violet sensitized photopolymer systems have been disclosed in for example U.S.

Pat. Nos. 3,359,109; 3,042,515; 4,258,123; 4,139,390; 5,141,839; 5,141,842; 4,232,106; 4,425,424; 5,030,548; 4,598,036; EP 434 968; WO 96/35143 and US 2003/68575.

The formation of a print-out image is also known for heat-sensitive photopolymer lithographic printing plates. Such plates are usually image-wise exposed by an IR laser and often comprise, beside an IR dye as a light-to-heat conversion compound, also a dye which absorbs in the visible light wavelength range and changes colour upon heating. This colour change can be obtained for example with a heat-decomposable dye which bleaches upon heating such as disclosed in EP 897 134, EP 925 916, WO 96/35143, EP 1 300 241. Alternatively, this heat-induced colour change can be the result of a shift of the absorption maximum of a visible dye as disclosed in EP 1 502 736 and EP 419 095. A problem associated with these prior art materials where the print-out image is formed by a heat-induced reduction of the visible light absorption or by a switch from a highly colored to a weakly colored coating, is that the obtained print-out images are characterized by only a low contrast between the exposed and the non-exposed areas, high levels of dyes are required, and/or an increased risk of contamination of the development/rinse section.

Contrast-providing colorants obtained from the so-called leuco dyes that switch colour upon changes in pH, temperature, UV etc, have been widely used in the art. The leuco dye technology involves a switch between two chemical forms whereby one is colourless. If the colour switch is caused by for example pH or temperature, the transformation is reversible. Irreversible switches are typically based on redox reactions.

The use of contrast-providing colorants obtained from leuco dyes that become coloured in the presence of a thermal acid generator, is described for example, in U.S. Pat. Nos. 7,402,374; 7,425,406 and 7,462,440. The colouring of the printing areas is initiated by image-wise exposure whereby the image areas are visualized before performing development of the plate precursor. However, only a weak image contrast which fades away in time is obtained with this leuco dye technology and, moreover, high exposure energies are required to generate a contrast.

EP 2 297 611 discloses an imaging element comprising a topcoat layer disposed on a photopolymerisable imageable layer comprising a water-soluble polymer binder and a composition that is capable of changing colour upon exposure to infrared radiation which comprises an acid-generating compound, an infrared radiation absorbing compound and optionally one or more compounds that generate a colour in the presence of the acid.

Thermochromic dye technology involves the design of an IR dye containing a thermocleavable group whereby a colour shift is obtained upon exposure with heat and/or light. This technology offers lithographic contrast which is enhanced by increasing either the thermochromic dye concentration or the exposure energy. However, this technology is especially suitable for thermofuse plates—i.e. plates including an image-recording layer that works by heat-induced particle coalescence of a thermoplastic polymer latex,—and does not work well in the photosensitive layer of photopolymer based printing plates. Indeed, only an acceptable contrast in such printing plates is feasible when exposed by very high laser energy and/or when a substantially high concentration of the thermochromic dye is incorporated in the coating.

In conclusion, there is still a need for lithographic printing plates based on photopolymerisation including coating formulations which offer an improved contrast between the image areas and background areas upon imaging and which are preferably designed for direct on-press development.

SUMMARY OF INVENTION

It is therefore an object of the present invention to provide a negative-working printing plate based on photopolymerisation which offers an excellent visual contrast upon imaging, even before processing.

This object is realised by the printing plate precursor defined in claim 1 with preferred embodiments defined in the dependent claims. The printing plate material of the present invention has the specific feature that it contains a two layer coating of which the toplayer has a thickness—also referred to as total dry weight—comprised between 0.1 $g/m^2$ and 1.75 $g/m^2$ and includes an infrared absorbing compound capable of forming a coloured compound—whereby a print-out image is formed—upon exposure to IR light and/or heat. The infrared absorbing compound includes a thermocleavable group which transforms into a group which is a stronger electron-donor upon exposure to heat and/or IR radiation. A coloured compound is a compound which is visible for the human eye, typically the portion of the electromagnetic spectrum that is visible to the human eye are wavelengths from about 390 to 700 nm.

According to the current invention, it was surprisingly found that by incorporating the infrared absorbing compound capable of forming a coloured compound in the toplayer having a total dry weight comprised between 0.1 $g/m^2$ and 1.75 $g/m^2$, results in a very high visual contrast. It has been observed that upon heat and/or light exposure of the coating according to the present invention, a clear print-out image is formed even at low exposure energy levels; for example below 150 $mJ/m^2$. The formation of a print-out image is suppressed when the total dry weight of the protective topcoat is above 1.75 $g/m^2$.

The CIE 1976 colour distance ΔE measured before development and after exposure between exposed (image) and non-exposed (non-image) areas—for example with an energy density between 70 and 190 $mJ/m^2$, more preferably between 75 and 150 $mJ/m^2$, most preferably between 80 and 120 $mJ/m^2$, preferably has a value of at least 2. As a result, efficient plate detection by punch bender and/or registration systems is possible, the need for an additional ink jet print system to inkjet plate information after imaging and/or for a laborous precontrole of the plate by means of for example an acidic gum, is not needed anymore.

The development is preferably carried out by treating the precursor with a gum solution, however more preferably by mounting the precursor on a plate cylinder of a lithographic printing press and rotating the plate cylinder while feeding dampening liquid and/or ink to the precursor.

It is a further object of the present invention to provide a method for making a lithographic printing plate comprising the steps of:
  image-wise exposing the printing plate precursor including the coating as defined above to heat and/or IR radiation whereby a lithographic image consisting of image areas and non-image areas is formed and whereby a colour change in the imaged areas is induced;
  developing the exposed precursor.

Other features, elements, steps, characteristics and advantages of the present invention will become more apparent from the following detailed description of preferred embodiments of the present invention. Specific embodiments of the invention are also defined in the dependent claims.

DESCRIPTION OF EMBODIMENTS

The Lithographic Printing Plate Precursor

The lithographic printing plate precursor according to the present invention is negative-working, i.e. after exposure and development the non-exposed areas of the coating are removed from the support and define hydrophilic (non-printing) areas, whereas the exposed coating is not removed from the support and defines oleophilic (printing) areas. The hydrophilic areas are defined by the support which has a hydrophilic surface or is provided with a hydrophilic layer. The hydrophobic areas are defined by the coating, hardened upon exposing, optionally followed by a heating step. Areas having hydrophilic properties means areas having a higher affinity for an aqueous solution than for an oleophilic ink; areas having hydrophobic properties means areas having a higher affinity for an oleophilic ink than for an aqueous solution.

"Hardened" means that the coating becomes insoluble or non-dispersible for the developing solution and may be achieved through polymerization and/or crosslinking of the photosensitive coating, optionally followed by a heating step to enhance or to speed-up the polymerization and/or cross-linking reaction. In this optional heating step, hereinafter also referred to as "pre-heat", the plate precursor is heated, preferably at a temperature of about 80° C. to 150° C. and preferably during a dwell time of about 5 seconds to 1 minute.

The coating contains a toplayer and at least one layer including a photopolymerisable composition, said layer is also referred to as the "photopolymerisable layer". The toplayer is provided on top of the photopolymerisable layer. The coating may further include other layers such as for example an intermediate layer, located between the support and the photopolymerisable layer and/or between the top layer and the photopolymerisable layer, an adhesion improving layer and/or other layers.

The coating of the printing plate precursor is most preferably capable of being developed on-press with dampening liquid and/or ink.

The printing plate of the present invention is characterized in that it can be exposed at a low energy density, i.e. below 190 mJ/m²; preferably between 70 and 190 mJ/m²; more preferably between 75 and 150 mJ/m² and most preferably between 80 and 120 mJ/m².

Toplayer

The coating includes a toplayer or protective overcoat layer which preferably acts as an oxygen barrier layer. Low molecular weight substances present in the air may deteriorate or even inhibit image formation and therefore a toplayer is applied to the coating. A toplayer should preferably be easily removable during development, adhere sufficiently to the photopolymerisable layer or optional other layers of the coating and should preferably not inhibit the transmission of light during exposure. The toplayer is provided on top of the photopolymerisable layer.

The toplayer includes an infrared absorbing compound which is capable of forming a coloured compound—whereby a print-out image is formed—upon exposure to infrared light and/or heat. The infrared absorbing compound is preferably an infrared absorbing dye, also referred to as IR dye. The colour-forming IR dye is also referred to herein as thermochromic infrared absorbing dye or thermochromic IR dye. The thermochromic IR dye has a main absorption in the infrared wavelength range of the electromagnetic spectrum—i.e. a wavelength range between about 750 and 1500 nm—and does preferably not have a substantial light absorption in the visible wavelength range of the electromagnetic spectrum—i.e. a wavelength range between 390 and 700 nm. The thermochromic compound, preferably a dye, includes at least one thermocleavable group which is transformed by a chemical reaction, induced by exposure to IR radiation or heat, into a group which is a stronger electron-donor. As a result, the exposed thermochromic IR dye absorbs substantially more light in the visible wavelength range of the electromagnetic spectrum, or in other words, the thermochromic dye undergoes a hypsochromic shift whereby a visible image is formed, also referred to as print-out image. The formation of this print-out image is clearly different from a process of the prior art where a compound changes from an essentially colourless compound into a pale-coloured to coloured compound. These compounds typically change absorption from the UV wavelength range of the electromagnetic spectrum to the visible wavelength range of the electromagnetic spectrum, i.e. these compounds typically have a batochromic shift. The contrast of the print-out image obtained by such a process is much weaker compared to the colour forming process described above of the thermochromic IR dyes of the present invention.

The contrast of the print-out image may be defined as the difference between the optical density at the exposed area and the optical density at the non-exposed area, and is preferably as high as possible. This enables the end-user to establish immediately whether or not the precursor has already been exposed and processed, to distinguish the different color selections and to inspect the quality of the image on the plate precursor. The contrast of the print-out image preferably increases with increasing optical density in the exposed areas and can be measured in reflectance using an optical densitometer, equipped with several filters (e.g. cyan, magenta, yellow).

The concentration of the thermochromic IR dyes with respect to the total dry weight of the coating, may be from 0.1% wt to 20.0% wt, more preferably from 0.5% wt to 15.0% wt, most preferred from 1.0% to 10.0% wt.

The thermochromic dye is preferably represented by Formulae I, II or III:

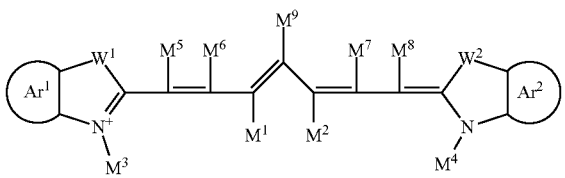

Formula I

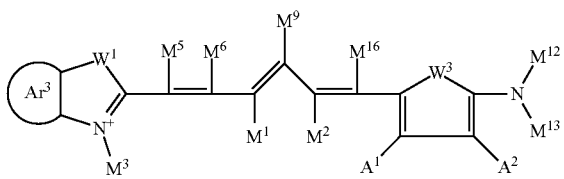

Formula II

Formula III

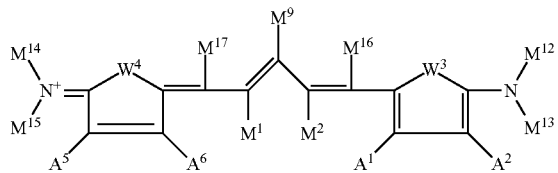

wherein
- $Ar^1$, $Ar^2$ and $Ar^3$ independently represent an optionally substituted aromatic hydrocarbon group or an aromatic hydrocarbon group with an annulated benzene ring which is optionally substituted,
- $W^1$ and $W^2$ independently represent a sulphur atom, an oxygen atom, NR" wherein R" represents an optionally substituted alkyl group, NH, or a —$CM^{10}M^{11}$ group wherein $M^{10}$ and $M^{11}$ are independently an optionally substituted aliphatic hydrocarbon group or an optionally substituted (hetero)aryl group, or wherein $M^{10}$ and $M^{11}$ together comprise the necessary atoms to form a cyclic structure, preferably a 5- or 6-membered ring;
- $W^3$ represent a sulphur atom or a —$C(A^3)=C(A^4)$-group,
- $W^4$ represents a sulphur atom or a —$C(A^7)=C(A^8)$-group,
- $M^1$ and $M^2$ independently represent hydrogen, an optionally substituted aliphatic hydrocarbon group or together comprise the necessary atoms to form an optionally substituted cyclic structure, preferably $M^1$ and $M^2$ together comprise the necessary atoms to form an optionally substituted cyclic structure which may comprise an optionally substituted annulated benzene ring, preferably a 5- or 6-membered ring, more preferably a 5-membered ring, most preferably a 5-membered ring having a cyclic structure of 5 carbon atoms;
- $M^3$ and $M^4$ independently represent an optionally substituted aliphatic hydrocarbon group;
- $M^5$, $M^6$, $M^7$ and $M^8$, $M^{16}$ and $M^{17}$ independently represent hydrogen, a halogen or an optionally substituted aliphatic hydrocarbon group,
- $A^1$ to $A^8$ independently represent hydrogen, a halogen atom, an optionally substituted aliphatic hydrocarbon group or an optionally substituted (hetero)aryl group, or wherein each of $A^1$ and $A^2$, $A^3$ and $A^4$, $A^5$ and $A^6$, or, $A^7$ and $A^8$, together comprise the necessary atoms to form a cyclic structure, preferably 5- or 6-membered ring;
- $M^{12}$ and $M^{13}$ and $M^{14}$ and $M^{15}$ independently represent an optionally substituted aliphatic hydrocarbon group or an optionally substituted (hetero)aryl group, or wherein, two of said $M^{14}$, $M^{15}$, $A^5$ or $A^7$ together comprise the necessary atoms to form at least one cyclic structure, preferably 5- or 6-membered ring; two of said $M^{12}$, $M^{13}$, $A^2$ or $A^4$ together comprise the necessary atoms to form at least one cyclic structure preferably 5- or 6-membered ring;
- $M^9$ is a group which is transformed by a chemical reaction, induced by exposure to IR radiation or heat, into a group which is a stronger electron-donor than said $M^9$; and said transformation provides an increase of the integrated light absorption of said dye between 350 and 700 nm;
- and optionally one or more counter ions in order to obtain an electrically neutral compound.

The thermochromic IR dye can be a neutral, an anionic or a cationic dye depending on the type of the substituting groups and the number of each of the substituting groups. In a preferred embodiment, the dye of formula I, II or III comprises at least one anionic or acid group such as —$CO_2H$, —$CONHSO_2R^h$, —$SO_2NHCOR^i$, —$SO_2NHSO_2R^j$, —$PO_3H_2$, —$OPO_3H_2$, —$OSO_3H$, —$S$—$SO_3H$ or —$SO_3H$ groups or their corresponding salts, wherein $R^h$, $R^i$ and $R^j$ are independently an aryl or an alkyl group, preferably a methyl group, and wherein the salts are preferably alkali metal salts or ammonium salts, including mono- or di- or tri- or tetra-alkyl ammonium salts. These anionic or acid groups may be present on the aromatic hydrocarbon group or the annulated benzene ring of $Ar^1$, $Ar^2$ or $Ar^3$, or on the aliphatic hydrocarbon group of $M^3$, $M^4$ or $M^{12}$ to $M^{15}$, or on the (hetero)aryl group of $M^{12}$ to $M^{15}$. Other substituting groups can be selected from a halogen atom, a cyano group, a sulphone group, a carbonyl group or a carboxylic ester group.

In another preferred embodiment, at least one of $M^3$, $M^4$ or $M^{12}$ to $M^{15}$ is terminally substituted with at least one of these groups, more preferably with —$CO_2H$, —$CONHSO_2$-Me, —$SO_2NHCO$-Me, —$SO_2NHSO_2$-Me, —$PO_3H_2$ or —$SO_3H$ groups or their corresponding salt, wherein Me represents a methyl group.

In a preferred embodiment, the thermochromic IR dye is represented by Formulae I, II or III above includes $M^9$ represented by one of the following groups:

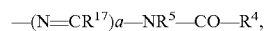

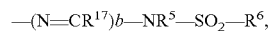

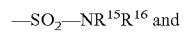

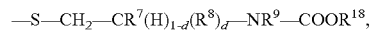

wherein
- a, b, c and d independently are 0 or 1;
- $R^{17}$ represents hydrogen, an optionally substituted aliphatic hydrocarbon group or an optionally substituted (hetero)aryl group, or wherein $R^{17}$ and $R^5$ or $R^{17}$ and $R^{11}$ together comprise the necessary atoms to form a cyclic structure;
- $R^4$ represents —$OR^{10}$, —$NR^{13}R^{14}$ or —$CF_3$;
- wherein $R^{10}$ represents an optionally substituted (hetero)aryl group or an optionally branched aliphatic hydrocarbon group;
- $R^{13}$ and $R^{14}$ independently represent hydrogen, an optionally substituted aliphatic hydrocarbon group or an optionally substituted (hetero)aryl group, or wherein $R^{13}$ and $R^{14}$ together comprise the necessary atoms to form a cyclic structure;
- $R^6$ represents an optionally substituted aliphatic hydrocarbon group or an optionally substituted (hetero)aryl group, —$OR^{10}$, —$NR^{13}R^{14}$ or —$CF_3$;
- $R^5$ represents hydrogen, an optionally substituted aliphatic hydrocarbon group, a $SO_3$— group, a —$COOR^{18}$ group or an optionally substituted (hetero)aryl group, or wherein $R^5$ together with at least one of $R^{10}$, $R^{13}$ and $R^{14}$ comprise the necessary atoms to form a cyclic structure;
- $R^{11}$, $R^{15}$ and $R^{16}$ independently represent hydrogen, an optionally substituted aliphatic hydrocarbon group or an optionally substituted (hetero)aryl group, or wherein $R^{15}$ and $R^{16}$ together comprise the necessary atoms to form a cyclic structure;

$R^{12}$ represents an optionally substituted aliphatic hydrocarbon group or an optionally substituted (hetero)aryl group;

$R^7$ and $R^9$ independently represent hydrogen or an optionally substituted aliphatic hydrocarbon group;

$R^8$ represents —COO— or —COOR$^{8'}$ wherein R$^{8'}$ represents hydrogen, an alkali metal cation, an ammonium ion or a mono-, di-, tri- or tetra-alkyl ammonium ion;

$R^{18}$ represents an optionally substituted (hetero)aryl group or an alpha-branched aliphatic hydrocarbon group.

Suitable examples of thermochromic IR dyes used in the present invention are described in EP 1 910 082 pages 4 to 8, IRD-001 to IRD-101, and incorporated herein by reference.

In a highly preferred embodiment, the thermochromic IR dye is represented by Formula IV

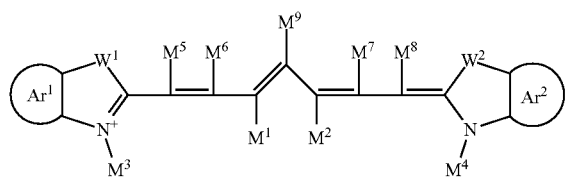

wherein $Ar^1$, $Ar^2$, $W^1$, $W^2$ and $M^1$ to $M^9$ are as defined above.

Most preferably the thermochromic IR dye is represented by Formula IV wherein $Ar^1$ and $Ar^2$ independently represent an optionally substituted aryl group;
optionally annulated with an optionally substituted benzene ring,
$W^1$ and $W^2$ represent —C(CH$_3$)$_2$;
$M^1$ and $M^2$ together comprise the necessary atoms to form an optionally substituted 5-membered ring which may comprise an optionally substituted annulated benzene ring;
$M^3$ and $M^4$ independently represent an optionally substituted aliphatic hydrocarbon group,
$M^5$, $M^6$, $M^7$ and $M^8$ represent hydrogen;
$M^9$ represents

—NR$^5$—CO—R$^4$

—NR$^5$—SO$_2$—R$^6$

—NR$^{11}$—SO—R$^{12}$

—SO$_2$—NR$^{15}$R$^{16}$ wherein $R^4$, $R^5$, $R^6$, $R^{11}$, $R^{12}$, $R^{15}$, and $R^{16}$ are as defined above;
and optionally one or more counter ions in order to obtain an electrically neutral compound. Preferably the IR dye comprises at least one anionic group or an acid group, such as —CO$_2$H, —CONHSO$_2$R$^h$, —SO$_2$NHCOR$^i$, —SO$_2$NHSO$_2$R$^j$, —PO$_3$H$_2$, —OPO$_3$H$_2$, —OSO$_3$H, —SO$_3$H or —S—SO$_3$H groups or their corresponding salts, wherein R$^h$, R$^i$ and R$^j$ are independently an aryl or an alkyl group. More preferably, at least one of the aliphatic hydrocarbon groups of $M^3$ or $M^4$ is terminally substituted with at least one of said anionic groups or acid groups.

In a highly preferred embodiment the thermochromic IR dye is represented by Formula IV wherein $Ar^1$ and $Ar^2$ independently represent an optionally substituted aryl group;
$W^1$ and $W^2$ represent —C(CH$_3$)$_2$;
$M^1$ and $M^2$ together comprise the necessary atoms to form an optionally substituted 5-membered ring which may comprise an optionally substituted annulated benzene ring;
$M^3$ and $M^4$ independently represent an optionally substituted aliphatic hydrocarbon group,
$M^5$, $M^6$, $M^7$ and $M^8$ represent hydrogen;
$M^9$ represents

—NR$^5$—CO—R$^4$

—NR$^5$—SO$_2$—R$^6$ wherein $R^4$ is —OR$^{10}$, wherein R$^{10}$ is an optionally branched aliphatic hydrocarbon group;

$R^5$ represents hydrogen, an optionally substituted aliphatic hydrocarbon group or an optionally substituted (hetero)aryl group, $R^6$ represents an optionally substituted aliphatic hydrocarbon group or an optionally substituted (hetero)aryl group; and optionally one or more counter ions in order to obtain an electrically neutral compound.

Preferably the IR dye comprises at least one anionic group or an acid group, such as —CO$_2$H, —CONHSO$_2$R$^h$, —SO$_2$NHCOR$^i$, —SO$_2$NHSO$_2$R$^j$, —PO$_3$H$_2$, —OPO$_3$H$_2$, —OSO$_3$H, —SO$_3$H or —S—SO$_3$H groups or their corresponding salts, wherein R$^h$, R$^i$ and R$^j$ are independently an aryl or an alkyl group. More preferably, at least one of the aliphatic hydrocarbon groups of $M^3$ or $M^4$ is terminally substituted with at least one of said anionic groups or acid groups. The salts are preferably alkali metal salts or ammonium salts, including mono- or di- or tri- or tetra-alkyl ammonium salts.

The optional counter ions in order to obtain an electrically neutral compound may be selected from for example a halogen, a sulphonate, a perfluorosulphonate, a tosylate, a tetrafluoroborate, a hexafluorophosphate, an arylborate, an arylsulphonate; or a cation such as alkali metal salts or ammonium salts, including mono- or di- or tri- or tetra-alkyl ammonium salts.

Especially preferred thermochromic IR dye are presented by one of the following formulae V to XII:

Formula V

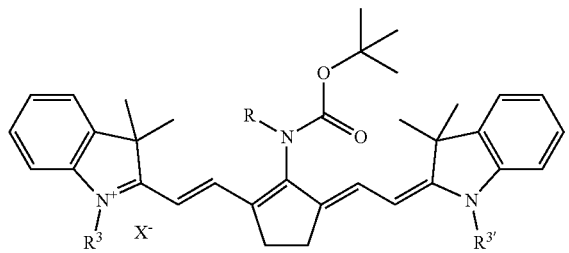

-continued

Formula VI

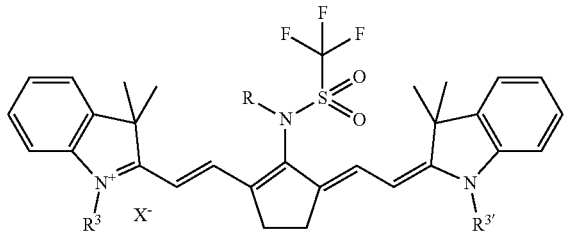

wherein

X⁻ represents halogen, sulphonate, perfluorosulphonate, tosylate, tetrafluoroborate, hexafluorophosphate, arylborate or arylsulphonate;

R is hydrogen, an optionally substituted aliphatic hydrocarbon group, or an optionally substituted (hetero)aryl group; and $R^3$, $R^{3'}$ independently represent an optionally substituted alkyl group, preferably a methyl or ethyl; or an ether group, preferably —CH$_2$—CH$_2$—O—CH$_3$;

Formula VII

[Structure with ⁻O₃S and SO₃⁻M⁺ groups]

Formula VIII

[Structure with CF₃ group, ⁻O₃S and SO₃⁻M⁺ groups]

Formula IX

[Structure with tosyl group, ⁻O₃S and SO₃⁻Na⁺ groups]

wherein

M⁺=Li⁺, Na⁺, K⁺, NH$_4^+$, R'R"R'"NH⁺ wherein R', R", R'" independently represent hydrogen, an optional substituted alkyl or aryl group;

Formula X

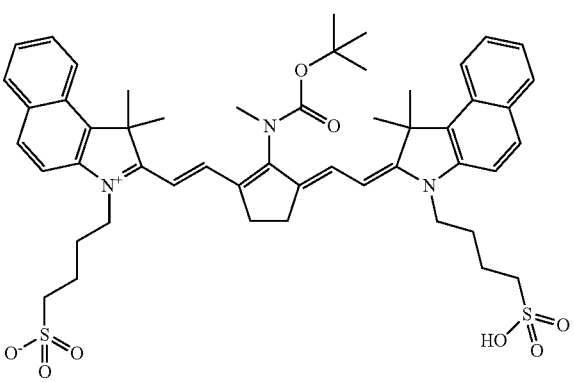

Formula XI

[Structure with naphthalene groups, CF₃ and sulphonate groups]

Formula XII

[Structure with CN groups, CF₃ and sulphonate groups]

The thermochromic IR dyes mentioned above may also be coupled to each other or to other IR dyes as to form IR dye dimers or oligomers. Besides a covalent coupling between two or more thermochromic IR dyes, supra-molecular complexes, comprising two or more thermochromic IR dyes, may also be formed by ionic interactions. Dimers, consisting of two different IR dyes, may be formed for example by an interaction between a cationic and an anionic IR dye, as described in e.g. WO/2004069938 and EP 1 466 728. IR dyes may also be ionically bond to a polymer as e.g. described in EP 1 582 346 wherein IR dyes, comprising two to four sulphonate groups are ionically bonded to a polymer comprising covalently attached ammonium, phosphonium, and sulphoniunn groups.

Supra-molecular complexes comprising two or more thermochromic IR dyes, may also be formed by hydrogen bonding or dipole-dipole interaction.

The colour difference between the exposed and non-exposed areas of the coating calculated from the L*a*b* values of the image areas (exposed areas) of the coating and the L*a*b* values of non-image areas (non-exposed areas) of the coating, is denoted as ΔE. Upon exposure of the coating of the present invention even with a low energy density, for example between 70 and 190 mJ/m$^2$, more preferably between 75 and 150 mJ/m$^2$, most preferably between 80 and 120 mJ/m$^2$, a print-out image is formed characterised by a CIE 1976 colour difference ΔE of at least 2, more preferably at least 2.5 and most preferably at least 3. According to the present invention, a CIE 1976 colour difference ΔE of at least 2 is obtained at very low exposure energies, for example below 150 mJ/m$^2$. ΔE is the CIE 1976 colour distance Delta E that is defined by the pair wise Euclidean distance of the CIE L*a*b* colour coordinates. CIE L*a*b* colour coordinates are obtained from reflection measurement in 45/0 geometry (non-polarized), using CIE 2° observer and D50 as illuminant. More details are described in CIE S 014-4/E: 2007 Colourimetry—Part 4: CIE 1976 L*a*b* Colour Spaces and CIE publications and CIE S 014-1/E:2006, CIE Standard Colourimetric Observers.

The CIE 1976 colour coordinates L*, a* and b* discussed herein are part of the well-known CIE (Commission Internationale de l'Eclairage) system of tristimulus colour coordinates, which also includes the additional chroma value C* defined as $C^*=[(a)^2+(b)^2]^{1/2}$. The CIE 1976 colour system is described in e.g. "Colorimetry, CIE 116-1995: Industrial Colour Difference Evaluation", or in "Measuring Colour" by R. W. G. Hunt, second edition, edited in 1992 by Ellis Horwood Limited, England.

CIE L*a*b* values discussed and reported herein have been measured following the ASTM E308-85 method.

The toplayer may further include a binder. Preferred binders which can be used in the toplayer are polyvinyl alcohol. The polyvinylalcohol has preferably a hydrolysis degree ranging between 74 mol % and 99 mol %, more preferably between 80-98%. The weight average molecular weight of the polyvinylalcohol can be measured by the viscosity of an aqueous solution, 4% by weight, at 20° C. as defined in DIN 53 015, and this viscosity number ranges preferably between 2 and 26, more preferably between 2 and 15, most preferably between 2 and 10.

The overcoat layer may optionally include other ingredients such as inorganic or organic acids, inorganic or organic fillers, matting agents, surfactants, (organic) waxes or wetting agents as disclosed in EP 2 916 171 and are incorporated herein by reference.

The coating thickness of the toplayer is between 0.10 and 1.75 g/m$^2$, preferably between 0.20 and 1.30 g/m$^2$, more preferably between 0.25 and 1.0 g/m$^2$ and most preferably between 0.30 and 0.80 g/m$^2$. In a more preferred embodiment of the present invention, the toplayer has a coating thickness between 0.25 and 1.75 g/m$^2$ and comprises a polyvinylalcohol having a hydrolysis degree ranging between 74 mol % and 99 mol % and a viscosity number as defined above ranging between 3 and 26.

The hydrophilic polymers in the protective overcoat layer may result in a problematic viscosity increase of press chemicals such as for example fountain solution and/or developer solution. Therefore, the thickness of the protective overcoat layer should preferably not be too high e.g. above the ranges as given above.

Definitions

An aliphatic hydrocarbon group preferably represents an alkyl, cycloalkyl, alkenyl, cyclo alkenyl or alkynyl group; suitable groups thereof are described below. An aromatic hydrocarbon group preferably represents a hetero(aryl) group; suitable hetero(aryl) groups—i.e. suitable aryl or heteroaryl groups—are described below.

The term "alkyl" herein means all variants possible for each number of carbon atoms in the alkyl group i.e. methyl, ethyl, for three carbon atoms: n-propyl and isopropyl; for four carbon atoms: n-butyl, isobutyl and tertiary-butyl; for five carbon atoms: n-pentyl, 1,1-dimethyl-propyl, 2,2-dimethylpropyl and 2-methyl-butyl, etc. Examples of suitable alkyl groups are methyl, ethyl, n-propyl, isopropyl, n-butyl, 1-isobutyl, 2-isobutyl and tertiary-butyl, n-pentyl, n-hexyl, chloromethyl, trichloromethyl, iso-propyl, iso-butyl, iso-pentyl, neo-pentyl, 1-methylbutyl and iso-hexyl, 1,1-dimethyl-propyl, 2,2-dimethylpropyl and 2-methyl-butyl, cyclopropyl, cyclobutyl, cyclopentyl, cyclohexyl and methylcyclohexyl groups. Preferably, the alkyl group is a $C_1$ to $C_6$-alkyl group.

A suitable alkenyl group is preferably a $C_2$ to $C_6$-alkenyl group such as an ethenyl, n-propenyl, n-butenyl, n-pentenyl, n-hexenyl, iso-propenyl, iso-butenyl, iso-pentenyl, neo-pentenyl, 1-methylbutenyl, iso-hexenyl, cyclopentenyl, cyclohexenyl and methylcyclohexenyl group.

A suitable alkynyl group is preferably a $C_2$ to $C_6$-alkynyl group; a suitable aralkyl group is preferably a phenyl group or naphthyl group including one, two, three or more $C_1$ to $C_6$-alkyl groups; a suitable alkaryl group is preferably a $C_1$ to $C_6$-alkyl group including an aryl group, preferably a phenyl group or naphthyl group.

A cyclic group or cyclic structure includes at least one ring structure and may be a monocyclic- or polycyclic group, meaning one or more rings fused together.

Examples of suitable aryl groups may be represented by for example an optionally substituted phenyl, benzyl, tolyl or an ortho- meta- or para-xylyl group, an optionally substituted naphtyl, anthracenyl, phenanthrenyl, and/or combinations thereof. The heteroaryl group is preferably a monocyclic or polycyclic aromatic ring comprising carbon atoms and one or more heteroatoms in the ring structure, preferably, 1 to 4 heteroatoms, independently selected from nitrogen, oxygen, selenium and sulphur. Preferred examples thereof include an optionally substituted furyl, pyridinyl, pyrimidyl, pyrazoyl, imidazoyl, oxazoyl, isoxazoyl, thienyl, tetrazoyl, thiazoyl, (1,2,3)triazoyl, (1,2,4)triazoyl, thiadiazoyl, thiofenyl group and/or combinations thereof.

A cyclic group or cyclic structure includes at least one ring structure and may be a monocyclic- or polycyclic group, meaning one or more rings fused together.

Halogens are selected from fluorine, chlorine, bromine or iodine.

The term "substituted", in e.g. substituted alkyl group means that the alkyl group may be substituted by other atoms than the atoms normally present in such a group, i.e. carbon and hydrogen. For example, a substituted alkyl group may include a halogen atom or a thiol group. An unsubstituted alkyl group contains only carbon and hydrogen atoms.

The optional substituents on the alkyl, cycloalkyl, alkenyl, cycloalkenyl, alkynyl, aralkyl, alkaryl, aryl and heteroaryl group are preferably selected from —Cl, —Br, —I, —OH, —SH, —CN, —NO$_2$, an alkyl group such as a methyl or ethyl group, an alkoxy group such as a methoxy or an ethoxy group, an aryloxy group, a carboxylic acid group or an alkyl ester thereof, a sulphonic acid group or an alkyl ester thereof, a phosphonic acid group or an alkyl ester thereof, a phosphoric acid group or an an ester such as an alkyl ester such as methyl ester or ethyl ester, a thioalkyl group, a thioaryl group, thioheteroaryl, —SH, a thioether such as a thioalkyl or thioaryl, ketone, aldehyde, sulfoxide, sulfone, sulfonate ester, sulphonamide, an amino, ethenyl, alkenyl, alkynyl, cycloalkyl, alkaryl, aralkyl, aryl, heteroaryl or heteroalicyclic group and/or combinations thereof.

Support

The lithographic printing plate used in the present invention comprises a support which has a hydrophilic surface or which is provided with a hydrophilic layer. The support is preferably a grained and anodized aluminium support, well known in the art. Suitable supports are for example disclosed in EP 1 843 203 (paragraphs [0066] to [0075]). The surface roughness, obtained after the graining step, is often expressed as arithmetical mean center-line roughness Ra (ISO 4287/1 or DIN 4762) and may vary between 0.05 and 1.5 µm. The aluminum substrate of the current invention has preferably an Ra value between 0.1 and 1.4 µm, more preferably between 0.3 and 1.0 µm and most preferably between 0.4 and 0.9 µm. The lower limit of the Ra value is preferably about 0.1 µm. More details concerning the preferred Ra values of the surface of the grained and anodized aluminum support are described in EP 1 356 926. By anodising the aluminum support, an $Al_2O_3$ layer is formed and the anodic weight ($g/m^2$ $Al_2O_3$ formed on the aluminum surface) varies between 1 and 8 $g/m^2$. The anodic weight is preferably ≥2.0 $g/m^2$, more preferably ≥2.5 $g/m^2$ and most preferably ≥3.0 $g/m^2$ The grained and anodized aluminium support may be subjected to so-called post-anodic treatments, for example a treatment with polyvinylphosphonic acid or derivatives thereof, a treatment with polyacrylic acid or derivatives thereof, a treatment with potassium fluorozirconate or a phosphate, a treatment with an alkali metal silicate, or combinations thereof. Enlargement or sealing of micropores of the amodized aluminum as disclosed in JP2001-253181A or JP2001-322365A may be performed. Alternatively, the support may be treated with an adhesion promoting compound such as those described in EP 1 788 434 in [0010] and in WO 2013/182328. However, for a precursor optimized to be used without a pre-heat step it is preferred to use a grained and anodized aluminium support without any post-anodic treatment.

Besides an aluminium support, a plastic support, for example a polyester support, provided with one or more hydrophilic layers as disclosed in for example EP 1 025 992 may also be used.

Photopolymer Coating

Photopolymerisable Compound

The coating has at least one layer including a photopolymerisable composition, said layer is also referred to as the "photopolymerisable layer". The coating may include an intermediate layer, located between the support and the photopolymerisable layer.

The photopolymerisable layer includes at least one polymerisable compound, a photoinitiator and optionally a binder. The photopolymerisable layer has a coating thickness preferably ranging between 0.2 and 5.0 $g/m^2$, more preferably between 0.4 and 3.0 $g/m^2$, most preferably between 0.6 and 2.2 $g/m^2$.

According to a preferred embodiment of the present invention, the polymerisable compound is a polymerisable monomer or oligomer including at least one terminal ethylenic unsaturated group, hereinafter also referred to as "free-radical polymerisable monomer". The polymerisation involves the linking together of the free-radical polymerisable monomers. Suitable free-radical polymerisable monomers include, for example, multifunctional (meth)acrylate monomers (such as (meth)acrylate esters of ethylene glycol, trimethylolpropane, pentaerythritol, ethylene glycol, ethoxylated trimethylolpropane, urethane (meth)acrylate) and oligomeric amine di(meth)acrylates. The (meth)acrylic monomers may also have other ethylenically unsaturated groups or epoxide groups in addition to the (meth)acrylate group. The (meth)acrylate monomers may also contain an acidic (such as a carboxylic acid or phosphoric acid) or basic (such as an amine) functionality.

Suitable free-radical polymerisable monomers are disclosed in [0042] and [0050] of EP 2 916 171 and are incorporated herein by reference.

The Initiator

Any free radical initiator capable of generating free radicals upon exposure directly or in the presence of a sensitizer, is according to this invention a suitable initiator, also referred to herein as photoinitiator. Suitable examples of photoinitiators include onium salts, carbon-halogen bond-containing compounds such as [1,3,5] triazines having trihalomethyl groups, organic peroxides, aromatic ketones, thio compounds, azo based polymerization initiators, azide compounds, ketooxime esters, hexaarylbisimidazoles, metallocenes, active ester compounds, borates and quinonediazides. Of these, onium salts, especially iodonium and/or sulfonium salts are preferable in view of storage stability.

More specific suitable free-radical initiators include, for example, the derivatives of acetophenone (such as 2,2-dimethoxy-2-phenylacetophenone, and 2-methyl-1-[4-(methylthio) phenyl]-2-morpholino propan-1-one); benzophenone; benzil; ketocoumarin (such as 3-benzoyl-7-methoxy coumarin and 7-methoxy coumarin); xanthone; thioxanthone; benzoin or an alkyl-substituted anthraquinone; onium salts (such as diaryliodonium hexafluoroantimonate, diaryliodonium triflate, (4-(2-hydroxytetradecyloxy)-phenyl) phenyliodonium hexafluoroantimonate, triarylsulfonium hexafluorophosphate, triarylsulfonium p-toluenesulfonate, (3-phenylpropan-2-onyl) triaryl phosphonium hexafluoroantimonate, and N-ethoxy(2-methyl) pyridinium hexafluorophosphate, and onium salts as described in U.S. Pat. Nos. 5,955,238, 6,037,098, and 5,629,354); borate salts (such as tetrabutylammonium triphenyl(n-butyl)borate, tetraethylammonium triphenyl(n-butyl)borate, diphenyliodonium tetraphenylborate, diphenyliodonium tetraphenylborate wherein the phenyl groups of the iodonium salt are substituted with a group including at least six carbon atoms, and triphenylsulfonium triphenyl(n-butyl)borate, and borate salts as described in U.S. Pat. Nos. 6,232,038 and 6,218,076,); haloalkyl substituted s-triazines (such as 2,4-bis(trichloromethyl)-6-(p-methoxy-styryl)-s-triazine, 2,4-bis(trichloromethyl)-6-(4-methoxy-naphth-1-yl)-s-triazine, 2,4-bis(trichloromethyl)-6-piperonyl-s-triazine, and 2,4-bis(trichloromethyl)-6-[(4-ethoxy-ethylenoxy)-phen-1-yl]-s-triazine, and s-triazines as described in U.S. Pat. Nos. 5,955,238, 6,037,098, 6,010,824 and 5,629,354); and titanocene (bis(etha.9-2,4-cyclopentadien-1-yl) bis[2,6-difluoro-3-(IH-pyrrol-1-yl)phenyl) titanium). Onium salts, borate salts, and s-triazines are preferred free radical initiators. Diaryliodonium salts and triarylsulfonium salts are preferred onium salts. Triarylalkylborate salts are preferred borate salts. Trichloromethyl substituted s-triazines are preferred s-triazines. These initiators may have optional substituents and may be used alone or in combination.

Optionally substituted trihaloalkyl sulfones wherein halo independently represents bromo, chloro or iodo and sulfone is a chemical compound containing a sulfonyl functional group attached to two carbon atoms, are particularly preferred initiators. Tribromomethyl phenyl sulfones are most preferred initiators. More details concerning this initiator can be found in unpublished copending application EP 18163285.2 paragraphs [0029] to [0040].

The amount of the initiator typically ranges from 0.05 to 30% by weight, preferably from 0.1 to 15% by weight, most preferably from 0.2 to 10% by weight relative to the total dry weight of the components in the photopolymerisable composition.

A very high sensitivity can be obtained by the combination of an optical brightener as sensitizer and a polymerisation initiator.

The photopolymerisable layer may also comprise a co-initiator. Typically, a co-initiator is used in combination with a free radical initiator. Suitable co-initiators for use in the photopolymer coating are disclosed in U.S. Pat. Nos. 6,410,205; 5,049,479; EP 1 079 276, EP 1 369 232, EP 1 369 231, EP 1 341 040, US 2003/0124460, EP 1 241 002, EP 1 288 720 and in the reference book including the cited refences: Chemistry & Technology UV & EB formulation for coatings, inks & paints—Volume 3—Photoinitiators for Free Radical and Cationic Polymerisation by K. K. Dietliker—Edited by P. K. T. Oldring—1991—ISBN 0 947798161. Specific co-initiators, as described in EP 107 792, may be present in the photopolymerizable layer to further increase the sensitivity. Preferred co-initiators are disclosed in EP 2 916 171 [0051] and are incorporated herein by reference.

A very high sensitivity can be obtained by including a sensitizer such as for example an optical brightener in the coating. Suitable examples of optical brighteners as sensitizers are described in WO 20051109103 page 24, line 20 to page 39. Useful sensitizers can be selected from the sensitizing dyes disclosed in U.S. Pat. Nos. 6,410,205; 5,049,479; EP 1 079 276, EP 1 369 232, EP 1 369 231, EP 1 341 040, US 2003/0124460, EP 1 241 002 and EP 1 288 720.

Specific co-initiators, as described in EP 107 792, may be present in the photopolymerizable layer to further increase the sensitivity. Preferred co-initiators are sulfur-compounds, especially thiols like e.g. 2-mercaptobenzothiazole, 2-mercaptobenzoxazole, 2-mercaptobenzimidazole, 4-methyl-3-propyl-1,2,4-triazoline-5-thione, 4-methyl-3-n-heptyl-1,2,4-triazoline-5-thione, 4-phenyl-3-n-heptyl-1,2,4-triazoline-5-thione, 4-phenyl-3,5-dimercapto-1,2,4-triazole, 4-n-decyl-3,5-dimercapto-1,2,4-triazole, 5-phenyl-2-mercapto-1,3,4-oxadiazole, 5-methylthio-1,3,4-thiadiazoline-2-thione, 5-hexylthio-1,3,4-thiadiazoline-2-thione, mercaptophenyltetrazole, pentaerythritol mercaptopropionate, butyric acid-3-mercapto-neopentanetetrayl ester, pentaerythritol tetra(thioglycolate). Other preferred co-initiators are polythioles as disclosed in WO 2006/048443 and WO 2006/048445. These polythiols may be used in combination with the above described thiols, e.g. 2-mercaptobenzothiazole.

The photopolymerizable layer may optionally include infrared light absorbing dyes as sensitizers absorbing light between 750 nm and 1300 nm, preferably between 780 nm and 1200 nm, more preferably between 800 nm and 1100 nm. Particular preferred sensitizers are heptamethinecyanine dyes disclosed in EP 1 359 008 paragraph [0030] to [0032].

The Binder

The photopolymerizable layer preferably includes a binder. The binder can be selected from a wide series of organic polymers. Compositions of different binders can also be used. Useful binders are described in for example EP 1 043 627 in paragraph [0013]. Also particulate shaped polymers including homopolymers or copolymers prepared from monomers such as ethylene, styrene, vinyl chloride, methyl acrylate, ethyl acrylate, methyl methacrylate, ethyl methacrylate, acrylonitrile, vinyl carbazole, acrylate or methacrylate, or mixtures thereof.

Thermally reactive polymer fine particles including a thermally reactive group such as an ethylenically unsaturated group, a cationic polymerizable group, an isocyanate group, an epoxy group, a vinyloxy group, and a functional group having an active hydrogen atom, a carboxy group, a hydroxy group, an amino group or an acid anhydride.

The average particle diameter of the polymer fine particle is preferably 0.01 mm to 3.0 mm. Particulate polymers in the form of microcapsules, microgels or reactive microgels are suitable as disclosed in EP 1 132 200; EP 1 724 112; US 2004/106060.

Other Ingredients

The photopolymerizable layer may also comprise particles which increase the resistance of the coating against manual or mechanical damage. The particles may be inorganic particles, organic particles or fillers such as described in for example U.S. Pat. No. 7,108,956. More details of suitable spacer particles described in EP 2 916 171 [0053] to [0056] are incorporated herein by reference.

The photopolymerizable layer may also comprise an inhibitor. Particular inhibitors for use in the photopolymer coating are disclosed in U.S. Pat. No. 6,410,205, EP 1 288 720 and EP 1 749 240.

The photopolymerizable layer may further comprise an adhesion promoting compound. The adhesion promoting compound is a compound capable of interacting with the support, preferably a compound having an addition-polymerizable ethylenically unsaturated bond and a functional group capable of interacting with the support. Under "interacting" is understood each type of physical and/or chemical reaction or process whereby, between the functional group and the support, a bond is formed which can be a covalent bond, an ionic bond, a complex bond, a coordinate bond or a hydrogen-bond, and which can be formed by an adsorption process, a chemical reaction, an acid-base reaction, a complex-forming reaction or a reaction of a chelating group or a ligand. The adhesion promoting compounds described in EP 2 916 171 [0058] are incorporated herein by reference.

Various surfactants may be added into the photopolymerisable layer to allow or enhance the developability of the precursor; especially developing with a gum solution. Both polymeric and small molecule surfactants for example non-ionic surfactants are preferred. More details are described in EP 2 916 171 [0059] and are incorporated herein by reference.

According to the present invention there is also provided a method for making a negative-working lithographic printing plate comprising the steps of imagewise exposing a printing plate precursor followed by developing the imagewise exposed precursor so that the non-exposed areas are dissolved in the developer solution. Optionally, after the imaging step, a heating step is carried out to enhance or to speed-up the polymerization and/or crosslinking reaction. The lithographic printing plate precursor can be prepared by (i) applying on a support the coating as described above and (ii) drying the precursor.

Exposure Step

The printing plate precursor is preferably image-wise exposed by a laser emitting IR light. Preferably, the image-wise exposing step is carried out off-press in a platesetter, i.e. an exposure apparatus suitable for image-wise exposing the precursor with a laser such as a laser diode, emitting around 830 nm or a Nd YAG laser emitting around 1060 nm, or by a conventional exposure in contact with a mask. In a preferred embodiment of the present invention, the precursor is image-wise exposed by a laser emitting IR light.

Preheat Step

After the exposing step, the precursor may be pre-heated in a preheating unit, preferably at a temperature of about 80° C. to 150° C. and preferably during a dwell time of about 5 seconds to 1 minute. This preheating unit may comprise a heating element, preferably an IR-lamp, an UV-lamp, heated air or a heated roll. Such a preheat step can be used for printing plate precursors comprising a photopolymerisable composition to enhance or to speed-up the polymerization and/or crosslinking reaction.

Development Step

Subsequently to the exposing step or the preheat step, when a preheat step is present, the plate precursor may be processed (developed). Before developing the imaged precursor, a pre-rinse step might be carried out especially for the negative-working lithographic printing precursors having a protective oxygen barrier or topcoat. This pre-rinse step can be carried out in a stand-alone apparatus or by manually rinsing the imaged precursor with water or the pre-rinse step can be carried out in a washing unit that is integrated in a processor used for developing the imaged precursor. The washing liquid is preferably water, more preferably tap water. More details concerning the wash step are described in EP 1 788 434 in [0026].

During the development step, the non-exposed areas of the image-recording layer are at least partially removed without essentially removing the exposed areas. The processing liquid, also referred to as developer, can be applied to the plate e.g. by rubbing with an impregnated pad, by dipping, immersing, coating, spincoating, spraying, pouring-on, either by hand or in an automatic processing apparatus. The treatment with a processing liquid may be combined with mechanical rubbing, e.g. by a rotating brush. During the development step, any water-soluble protective layer present is preferably also removed. The development is preferably carried out at temperatures between 20 and 40° C. in automated processing units.

In a highly preferred embodiment, the processing step as described above is replaced by an on-press processing whereby the imaged precursor is mounted on a press and processed on-press by rotating said plate cylinder while feeding dampening liquid and/or ink to the coating of the precursor to remove the unexposed areas from the support. In a preferred embodiment, only dampening liquid is supplied to the plate during start-up of the press and after a number of revolutions of the plate cylinder also the ink supply is switched on. In an alternative embodiment, supply of dampening liquid and ink is started simultaneously, or only ink can be supplied during a number of revolutions before switching on the supply of dampening liquid.

The processing step may also be performed by combining embodiments described above, e.g. combining development with a processing liquid with development on-press by applying ink and/or fountain.

Processing Liquid

The processing liquid may be an alkaline developer or solvent-based developer. Suitable alkaline developers have been described in US2005/0162505. An alkaline developer is an aqueous solution which has a pH of at least 11, more typically at least 12, preferably from 12 to 14. Alkaline developers typically contain alkaline agents to obtain high pH values can be inorganic or organic alkaline agents. The developers can comprise anionic, non-ionic and amphoteric surfactants (up to 3% on the total composition weight); biocides (antimicrobial and/or antifungal agents), antifoaming agents or chelating agents (such as alkali gluconates), and thickening agents (water soluble or water dispersible polyhydroxy compounds such as glycerine or polyethylene glycol).

Preferably, the processing liquid is a gum solution whereby during the development step the non-exposed areas of the photopolymerisable layer are removed from the support and the plate is gummed in a single step. The development with a gum solution has the additional benefit that, due to the remaining gum on the plate in the non-exposed areas, an additional gumming step is not required to protect the surface of the support in the non-printing areas. As a result, the precursor is processed and gummed in one single step which involves a less complex developing apparatus than a developing apparatus comprising a developer tank, a rinsing section and a gumming section. The gumming section may comprise at least one gumming unit or may comprise two or more gumming units. These gumming units may have the configuration of a cascade system, i.e. the gum solution, used in the second gumming unit and present in the second tank, overflows from the second tank to the first tank when gum replenishing solution is added in the second gumming unit or when the gum solution in the second gumming unit is used once-only, i.e. only starting gum solution is used to develop the precursor in this second gumming unit by preferably a spraying or jetting technique. More details concerning such gum development is described in EP1 788 444.

A gum solution is typically an aqueous liquid which comprises one or more surface protective compounds that are capable of protecting the lithographic image of a printing plate against contamination, e.g. by oxidation, fingerprints, fats, oils or dust, or damaging, e.g. by scratches during handling of the plate. Suitable examples of such surface protective compounds are film-forming hydrophilic polymers or surfactants. The layer that remains on the plate after treatment with the gum solution preferably comprises between 0.005 and 20 $g/m^2$ of the surface protective compound, more preferably between 0.010 and 10 $g/m^2$, most preferably between 0.020 and 5 $g/m^2$. More details concerning the surface protective compounds in the gum solution can be found in WO 2007/057348 page 9 line 3 to page 11 line 6. As the developed plate precursor is developed and gummed in one step, there is no need to post-treat the processed plate.

The gum solution preferably has a pH value between 3 and 11, more preferably between 4 and 10, even more preferably between 5 and 9, and most preferably between 6 and 8. A suitable gum solution is described in for example EP 1 342 568 in [0008] to [0022] and WO2005/111727. The gum solution may further comprise an inorganic salt, an anionic surfactant, a wetting agent, a chelate compound, an antiseptic compound, an anti-foaming compound and/or an ink receptivity agent and/or combinations thereof. More details about these additional ingredients are described in WO 2007/057348 page 11 line 22 to page 14 line 19.

Drying and Baking Step

After the processing step the plate may be dried in a drying unit. In a preferred embodiment the plate is dried by heating the plate in the drying unit which may contain at least one heating element selected from an IR-lamp, an UV-lamp, a heated metal roller or heated air.

After drying the plate can optionally be heated in a baking unit. More details concerning the heating in a baking unit can be found in WO 2007/057348 page 44 line 26 to page 45 line 20.

The printing plate thus obtained can be used for conventional, so-called wet offset printing, in which ink and an aqueous dampening liquid is supplied to the plate. Another suitable printing method uses a so-called single-fluid ink without a dampening liquid. Suitable single-fluid inks have been described in U.S. Pat. Nos. 4,045,232; 4,981,517 and 6,140,392. In a most preferred embodiment, the single-fluid ink comprises an ink phase, also called the hydrophobic or oleophilic phase, and a polyol phase as described in WO 00132705.

EXAMPLES

Example 1

1. Preparation of the Printing Plate Precursors
Preparation of the Aluminium Support S-01

A 0.3 mm thick aluminium foil was degreased by spraying with an aqueous solution containing 26 g/l NaOH at 65° C. for 2 seconds and rinsed with demineralised water for 1.5 seconds. The foil was then electrochemically grained during 10 seconds using an alternating current in an aqueous solution containing 15 g/l HCl, 15 g/l $SO_4^{2-}$ ions and 5 g/l $Al^{3+}$ ions at a temperature of 37° C. and a current density of about 100 A/dm2. Afterwards, the aluminium foil was then desmutted by etching with an aqueous solution containing 5.5 g/l of NaOH at 36° C. for 2 seconds and rinsed with demineralised water for 2 seconds. The foil was subsequently subjected to anodic oxidation during 15 seconds in an aqueous solution containing 145 g/l of sulfuric acid at a temperature of 50° C. and a current density of 17 A/dm2, then washed with demineralised water for 11 seconds and dried at 120° C. for 5 seconds.

The support thus obtained was characterized by a surface roughness Ra of 0.35-0.4 μm (measured with interferometer NT1100) and had an oxide weight of 3.0 g/m².
Preparation of Inventive Printing Plates PP-01 to PP-08 and Comparative Printing Plates PP-09 to PP-11
Photopolymerisable Layer The photosensitive composition PL-01 as defined in Table 1 was coated onto the above described support S-01. The components were dissolved in a mixture of 35% by volume of EK and 65% by volume of owanol PM (1-methoxy-2-propanol, commercially available from DOW CHEMICAL Company). The coating solution was applied at a wet coating thickness of 30 μm and then dried at 120° C. for 1 minute in a circulation oven.

TABLE 1 composition of the photosensitive layer

| Ingredients g/m² | PL-01 |
|---|---|
| FST 510 (1) | 0.250 |
| CN 104 (2) | 0.250 |
| Initiator-01 (3) | 0.045 |
| S2025 (4) | 0.020 |
| S-LEC BX35-Z (5) | 0.150 |
| Tegoglide 410 (6) | 0.0015 |
| Sipomer PAM 100 (7) | 0.130 |
| Albritect CP 30 (8) | 0.024 |

1) FST 510 is a reaction product from 1 mole of 2,2,4-trimethylhexamethylenediisocyanate and 2 moles of hydroxyethyl-methacrylate commercially available from AZ Electronics as a 82 wt. % solution in MEK;

2) CN 104 is an epoxy acrylate oligomer commercially available from Arkema;

3) Initiator-01 is bis(4-tert-butylphenyl)-iodonium tetraphenyl borate

4) S2025 is an infrared absorbing dye commercially available from FEW Chemicals

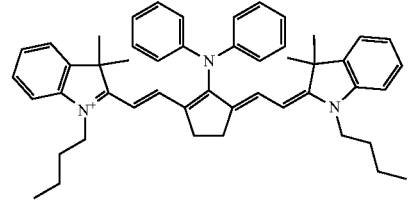

5) S-LEC BX35-Z, a polyvinylbutyral commercially available from Sekisui;

6) Tegoglide 410 is a surfactant commercially available from Evonik Tego Chemie GmbH;

7) Sipomer PAM 100 is a methacrylate phosphonic ester commercially available from Rhodia;

8) Albritect CP 30, is a copolymer of vinylphosphonic acid and acrylic acid commercially available as a 20 wt. % aqueous dispersion from Rhodia.

Protective Overcoat Layer

On top of the photosensitive layer, a solution in water with the compositions as defined in Tables 2 and 3 was coated (40 μm) on the photosensitive layer, and dried at 110° C. for 2 minutes. Inventive printing plate precursors PPP-01 to PPP-08 having a coating thickness of respectively 1.225; 1.245; 1.285; 1.985; 0.512 and 0.552 g/m² were obtained and comparative printing plate precursors PPP-09 to PPP-11 having a coating thickness of respectively 1.205; 0.510 and 0.522 g/m² were obtained.

TABLE 2 composition of the inventive protective overcoat layers (g/m²)

| Ingredients g/m² | OC-01 Inv | OC-02 Inv | OC-03 Inv | OC-04 Inv | OC-05 Inv | OC-06 Inv | OC-07 Inv | OC-08 Inv |
|---|---|---|---|---|---|---|---|---|
| Mowiol4-88 (1) | 0.736 | 0.736 | 0.736 | 0.736 | 0.450 | 0.450 | 0.450 | 0.450 |
| Mowiol8-88 (1) | 0.226 | 0.226 | 0.226 | 0.226 | — | — | — | — |
| Luviskol K30 (2) | 0.231 | 0.231 | 0.231 | 0.231 | — | — | — | — |
| IR-01 (3) | 0.020 | 0.040 | 0.080 | 0.150 | 0.020 | 0.050 | — | — |
| IR-02 (3) | — | — | — | — | — | — | 0.050 | 0.090 |
| Lutensol A8 (4) | 0.012 | 0.012 | 0.012 | 0.012 | 0.012 | 0.012 | 0.012 | 0.012 |

TABLE 2-continued composition of the inventive protective overcoat layers (g/m²)

| Ingredients g/m² | OC-01 Inv | OC-02 Inv | OC-03 Inv | OC-04 Inv | OC-05 Inv | OC-06 Inv | OC-07 Inv | OC-08 Inv |
|---|---|---|---|---|---|---|---|---|

1) Mowiol 4-88 ™ and Mowiol 8-88 ™ are partially hydrolyzed polyvinylalcohols commercially available from Kuraray;
2) Luviskol K30TM is polyvinylpyrrolidone homopolymer commercially available from BASF;
3) IR-01 is an infrared absorbing dye having the following formula:

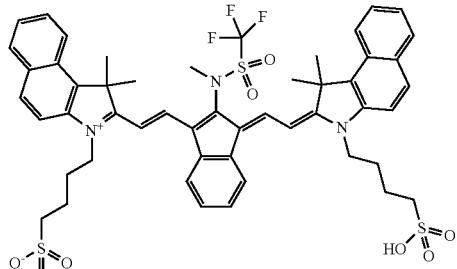

IR-02 is an infrared absorbing dye having the following formula:

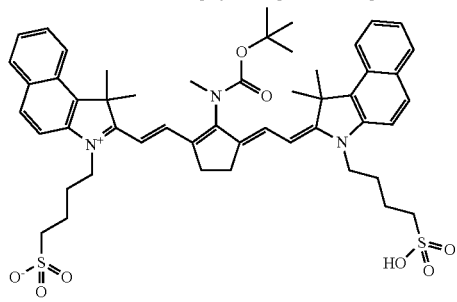 [SMILES: CN(C(=O)OC(C)(C)C)C1=C(/C=C/C2=[N+](CCCCS(=O)(=O)[O-])c3ccc4ccccc4c3C2(C)C)CC/C1=C\C=C1\N(CCCCS(=O)(=O)O)c2ccc3ccccc3c2C1(C)C]

4) Lutensol A8TM is a surface active agent commercially available from BASF.

TABLE 3 composition of the comparative protective overcoat layers

| Ingredients g/m² | OC-09 reference | OC-10 comparative | OC-11 comparative |
|---|---|---|---|
| Mowiol4-88 (1) | 0.736 | 0.410 | 0.410 |
| Mowiol8-88 (1) | 0.226 | — | — |
| Luviskol K30 (2) | 0.231 | — | — |
| IR-03 (3) | — | 0.020 | 0.020 |
| Black XV (4) | — | — | 0.020 |
| Omnicat 250 (5) | — | 0.060 | 0.060 |
| Lutensol A8 (6) | 0.012 | 0.012 | 0.012 |

(1) (2) and (6) see Table 2.
3) IR-03 is an infrared absorbing dye commercially available from FEW chemicals having the following formula:

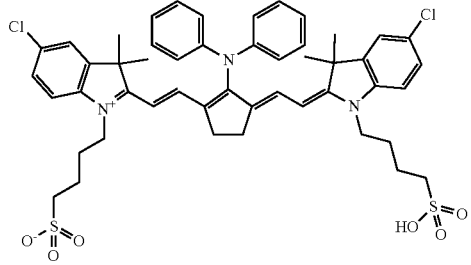 [SMILES: CC1(C)C(/C=C/C2=C(N(c3ccccc3)c3ccccc3)C(=C/C=C3/N(CCCCS(=O)(=O)O)c4ccc(Cl)cc4C3(C)C)/CC2)=[N+](CCCCS(=O)(=O)[O-])c2ccc(Cl)cc21]

4) Black XV is 6-diethylamino-3-methyl-2-(2,4-xylidino) fluoran, a leuco dye commercially available from Mitsui;
5) Acid generator is (4-methylphenyl)[4-(2-methylpropyl)phenyl]-hexafluorophosphate commercially available from IGM.

2. Imaging

The printing plate precursors PPP-01 to PPP-11 were imaged at 2400 dpi with a High Power Creo 40W TE38 thermal Platesetter™ (200 lpi Agfa Balanced Screening (ABS)), commercially available from Kodak and equipped with a 830 nm IR laser diode, at energy densities between 50 and 200 mJ/cm². Printing plates PP-01 to PP-11 were obtained.

3. ΔE Measurement

Lab measurement executed with a GretagMacBeth Spectro Eye reflection spectrophotometer with the settings: D50 (illuminant), 2° (Observer), No filter; commercially available from GretagMacBeth. The total colour difference ΔE is a single value that takes into account the difference between the L, a* and b* values of the image areas and the non-image areas:

$$\Delta E = \sqrt{\Delta L^2 + \Delta a^2 + \Delta b^2}$$

The higher the total colour difference ΔE, the better the obtained contrast. The contrast between image and non-image areas results in the occurrence of a print-out image.

4. Results

The total colour difference ΔE was measured and the results are summarized in the Tables 4 to 7 below.

A total colour difference ΔE above or equal to 2 is defined as a clear print out image. A total colour difference ΔE below 2 is defined as an unsufficient print out image.

4.1 Effect of the Concentration of the Dye in the OC

TABLE 4

Concentration of the IR-01 in the OC

| Printing plate | Overcoat layer | IR dye g/m² | Exposure energy mJ/cm² | ΔE* |
|---|---|---|---|---|
| PP-01 inventive | OC-01 | 0.020 | 120 | 3.0 |

TABLE 4-continued

Concentration of the IR-01 in the OC

| Printing plate | Overcoat layer | IR dye g/m² | Exposure energy mJ/cm² | ΔE* |
|---|---|---|---|---|
| PP-02 inventive | OC-02 | 0.040 | 120 | 4.5 |
| PP-03 inventive | OC-03 | 0.080 | 120 | 8.2 |
| PP-04 inventive | OC-04 | 0.150 | 120 | 14.5 |

*see above

The results in Table 4 demonstrate that the print-out image is strong (the total colour difference ΔE is equal or higher than 2) for the inventive printing plates including an overcoat layer including the dye according to the present invention. The results further show that increasing the level of IR dye according to the present invention in the overcoat layer, further improves the print-out image; i.e. the total colour difference ΔE increases with an increasing level of IR dye according to the present invention.

4.2 Effect of the Exposure Energy

TABLE 5

Exposure energy

| Printing plate PP-04 | Exposure energy mJ/cm² | ΔE* |
|---|---|---|
| OC-04 Inventive | 60 | 2.6 |
| OC-04 Inventive | 120 | 14.5 |
| OC-04 Inventive | 180 | 25.8 |

*see above

The results in Table 5 demonstrate that the print-out image is strong (the total colour difference ΔE is equal or higher than 2) for the inventive printing plates including an overcoat layer including the dye according to the present invention. The results further show that the applied exposure energy setting significantly affects the print-out image; the higher the exposure energy, the higher ΔE.

4.3 Effect of the IR Dye and/or Concentration

TABLE 6

IR dye and/or concentration

| Printing plate | Overcoat layer | IR dye | Concentration g/m² | Exposure energy mJ/cm² | ΔE* |
|---|---|---|---|---|---|
| PP-05 Inventive | OC-05 | IR-01 | 0.02 | 150 | 3.9 |
| PP-06 Inventive | OC-06 | IR-01 | 0.05 | 150 | 8.2 |
| PP-07 Inventive | OC-07 | IR-02 | 0.05 | 150 | 5.2 |
| PP-08 Inventive | OC-08 | IR-02 | 0.09 | 150 | 11.2 |

*see above

The results in Table 6 demonstrate that the print-out image is strong—the total colour difference ΔE is equal or higher than 2—for the inventive printing plates including an overcoat layer including an IR dye according to the present invention.

4.4 Comparative Printing Plates

TABLE 7

Comparative Printing Plates

| Printing plate | Overcoat layer | Exposure energy (mJ/cm²) | ΔE* |
|---|---|---|---|
| PP-09 comparative | OC-09 | 120 | 1.3 |
| PP-10 comparative | OC-10 | 120 | 1.5 |
| PP-11 comparative | OC-11 | 120 | 1.9 |

The results in Table 7 demonstrate that the comparative printing plates PP-09 to PP-11 show a weak print-out image (the total colour difference ΔE is lower than 2). Comparative printing plates PP-10 and PP-11 which contain an IR dye of the prior art, an acid generator and/or a IR leuco dye of the prior art, result in a poor print-out image.

Example 2

1. Preparation of Comparative Printing Plate PP-12
Photopolymerisable Layer

The photopolymerisable layer PL-02 as defined in Table 8 was coated onto the above described support S-01 (see Example 1). The components were dissolved in a mixture of 35% by volume of MEK and 65% by volume of Dowanol PM (1-methoxy-2-propanol, commercially available from DOW CHEMICAL Company). The coating solution was applied at a wet coating thickness of 30 μm and then dried at 120° C. for 1 minute in a circulation oven.

TABLE 8 composition of the photosensitive layer (g/m²)

| Ingredients g/m² | PL-02 |
|---|---|
| FST 510 (1) | 0.250 |
| CN 104 (2) | 0.250 |
| Initiator-02 (3) | 0.060 |
| S0094 (4) | 0.020 |
| Ruco coat EC4811 (5) | 0.250 |
| Tegoglide 410 (6) | 0.0015 |
| Sipomer PAM 100 (7) | 0.130 |
| Albritect CP 30 (8) | 0.024 |

1) FST 510 is a reaction product from 1 mole of 2,2,4-trimethylhexamethylenediisocyanate and 2 moles of hydroxyethyl-methacrylate commercially available from AZ Electronics as a 82 wt. % solution in MEK;
2) CN 104 is an epoxy acrylate oligomer commercially available from Arkema;
3) Initiator-02 is 4-hydroxyphenyl-tribromomethyl-sulfone
4) S0094 is an infrared absorbing dye commercially available from FEW Chemicals having the following structure:

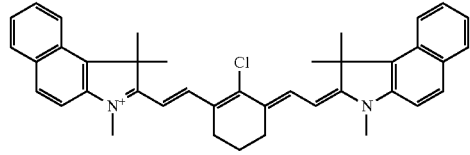 [SMILES: CN1/C(=C/C=C2\CCCC(/C=C/C3=[N+](C)c4ccc5ccccc5c4C3(C)C)=C2Cl)C(C)(C)c2c1ccc1ccccc21]

5) Ruco coat EC4811 is a polyether polyurethane commercially available from Rudolf Chemistry
6) Tegoglide 410 is a surfactant commercially available from Evonik Tego Chemie GmbH;
7) Sipomer PAM 100 is a methacrylate phosphonic ester commercially available from Rhodia;
8) Albritect CP 30, is a copolymer of vinylphosphonic acid and acrylic acid commercially available as a 20 wt. % aqueous dispersion from Rhodia.

Protective Top Layer

On top of the photosensitive layer, a solution in water with the composition as defined in Table 9 was coated on the photosensitive layer, and dried at 110° C. for 2 minutes. Printing plate precursor PPP-12 having a coating thickness of 2 g/m² was obtained.

TABLE 9

| composition of the protective layer (g/m²) | |
|---|---|
| Ingredients g/m² | OC-12 comp |
| Mowiol 4-88 (1) | 0.785 |
| Mowiol 8-88 (1) | 0.343 |
| Mowiol 6-98 (1) | 0.685 |
| IR-02 (2) | 0.158 |
| Acticide LA1206 (3) | 0.012 |
| Metolat FC 355 (4) | 0.018 |
| Lutensol A8 (5) | 0.0015 |

1) Mowiol 4-88TM, Mowiol 8-88TM are partially hydrolyzed polyvinylalcohols and Mowiol 6-98TM is a fully hydrolysed polyvinylalcohol commercially available from Kuraray;
2) IR-02 is an infrared absorbing dye having the following formula:

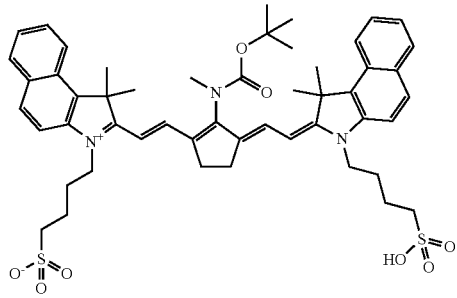 [SMILES: CN(C(=O)OC(C)(C)C)C1=C(/C=C/C2=[N+](CCCCS(=O)(=O)[O-])c3ccc4ccccc4c3C2(C)C)CC/C1=C\C=C1\N(CCCCS(=O)(=O)O)c2ccc3ccccc3c2C1(C)C]

3) Acticide LA1206 is a biocide, commercially available from Thor.
4) Metolat FC 355 is an ethoxylated ethylenediamine, commercially available from Munzing Chemie.
5) Lutensol A8TM is a surface active agent, commercially available from BASF.

2. Imaging

The printing plate precursor PPP-12 was imaged at 2400 dpi with a High Power Creo 40W TE38 thermal Platesetter™ (200 lpi Agfa Balanced Screening (ABS)), commercially available from Kodak and equipped with a 830 nm IR laser diode, at energy densities between 80 and 300 mJ/cm². Printing plate PP-12 was obtained.

3. ΔE Measurement

See Example 1

4. Results

The total colour difference ΔE was measured and the results are summarized in the Table 10 below.

A total colour difference ΔE above or equal to 2 is defined as a clear print out image. A total colour difference ΔE below 2 is defined as an unsufficient print out image.

TABLE 10

| ΔE of printing plate PP-12 Printing plate PP-12 Comparative | | | |
|---|---|---|---|
| Concentration IR dye mg/m² | OC thickness g/m² | Exposure energy mJ/cm² | ΔE |
| 0.157 | 2 g/m² | 90 | 0.6 |
| 0.157 | 2 g/m² | 120 | 0.4 |
| 0.157 | 2 g/m² | 150 | 0.5 |

The comparative samples clearly demonstrate that the formation of a printout image is suppressed when the total dry weight of the protective topcoat containing the thermochromic dye is too high, i.e. 2 g/m²: At a significantly elevated dye concentration (157 mg/m²), the printout image at exposure energies of 90 to 150 mJ/cm² remains very weak.

Example 3

1. Preparation of the Printing Plates PP-13 to PP-15

Preparation of the Aluminium Support S-01

See Example 1

Preparation of Inventive Printing Plate PP-13 and Comparative Printing Plate PP-14 and PP-15.

Photopolymerisable Layer

The photosensitive compositions as defined in Table 11 were coated onto the above described support S-01. The components were dissolved in a mixture of 35% by volume of MEK and 65% by volume of Dowanol PM (1-methoxy-2-propanol, commercially available from DOW CHEMICAL Company). The coating solution was applied at a wet coating thickness of 30 μm and then dried at 120° C. for 1 minute in a circulation oven.

TABLE 11

| composition of the photosensitive layer | | | |
|---|---|---|---|
| Ingredients g/m² | PL-03 | PL-04 | PL-05 |
| FST 510 (1) | 0.250 | 0.250 | 0.250 |
| CN 104 (2) | 0.250 | 0.250 | 0.250 |
| Initiator-01 (4) | 0.045 | 0.045 | 0.045 |
| S2539 (5) | 0.020 | 0.020 | 0.020 |
| Ruco coat EC4811 (6) | 0.250 | 0.250 | 0.250 |
| Tegoglide 410 (9) | 0.0015 | 0.0015 | 0.0015 |
| Sipomer PAM 100 (10) | 0.130 | 0.130 | 0.130 |
| Albritec CP 30 (11) | 0.024 | 0.024 | 0.024 |
| Black XV (12) | — | 0.020 | — |
| IR-01 (13) | — | — | 0.020 |

1) FST 510 is a reaction product from 1 mole of 2,2,4-trimethylhexamethylenediisocyanate and 2 moles of hydroxyethyl-methacrylate commercially available from AZ Electronics as a 82 wt. % solution in MEK;
2) CN 104 is an epoxy acrylate oligomer commercially available from Arkema;
3) SR494 is an ethoxylated pentaerythritol tetraacrylate commercially available from Arkema;
4) Initiator-01 is bis(4-tert-butylphenyl)-iodonium tetraphenyl borate
5) S2539 is an infrared absorbing dye commercially available from FEW Chemicals having the following structure:

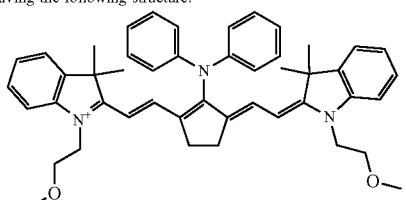

6) Ruco coat EC4811 is a polyether polyurethane commercially available from Rudolf Chemistry
7) S-LEC BX35-Z, S-LEC BL1 and S-LEC BL10 are polyvinylbutyral resins commercially available from Sekisui;
8) Gohsefimer LL-02 is a polyvinyl alcohol having a low hydrolysis degree commercially available from Nippon Goshei;
9) Tegoglide 410 is a surfactant commercially available from Evonik Tego Chemie GmbH;
10) Sipomer PAM 100 is a methacrylate phosphonic ester commercially available from Rhodia;
11) Albritect CP 30, is a copolymer of vinylphosphonic acid and acrylic acid commercially available as a 20 wt. % aqueous dispersion from Rhodia.
12) Black XV is 6-diethylamino-3-methyl-2-(2,4-xylidino) fluoran, a leuco dye commercially available from Mitsui

TABLE 11-continued composition of the photosensitive layer

| Ingredients g/m² | PL-03 | PL-04 | PL-05 |
|---|---|---|---|

13) IR-01 is an infrared absorbing dye having the following formula:

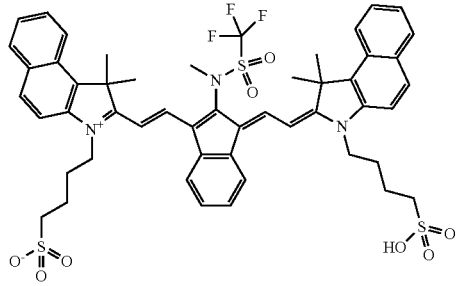 [SMILES: CN(C1=C(/C=C/C2=[N+](CCCCS(=O)(=O)[O-])c3ccc4ccccc4c3C2(C)C)c2ccccc2/C1=C\C=C1\N(CCCCS(=O)(=O)O)c2ccc3ccccc3c2C1(C)C)S(=O)(=O)C(F)(F)F]

Protective Top Layer

On top of the photosensitive layer, a solution in water with the compositions OC-13 and OC-14 as defined in Table 12 were coated (40 µm), and dried at 110° C. for 2 minutes. Printing plate precursors PPP-14 to PPP-16 having a coating thickness of respectively 0.54 and 0.49 g/m² were obtained.

TABLE 12 composition of the protective layers OC-13 and OC-14

| Ingredients g/m² | OC-13 inventive | OC-14 reference |
|---|---|---|
| Mowiol 4-88 (1) | 0.30 | 0.30 |
| Mowiol 4-98 (1) | 0.18 | 0.18 |
| IR-01 (2) | 0.05 | — |
| Lutensol A8 (3) | 0.01 | 0.01 |

1) Mowiol 4-88TM and Mowiol 4-98TM are partially hydrolyzed polyvinylalcohols commercially available from Kuraray;
2) IR-01 is an infrared absorbing dye having the following formula:

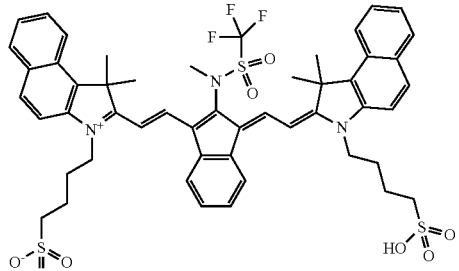

3) Lutensol A8TM is a surface active agent commercially available from BASF.

2. Imaging

The printing plate precursors PPP-13 to PPP-15 were imaged at 2400 dpi with a High Power Creo 40W TE38 thermal Platesetter™ (200 lpi Agfa Balanced Screening (ABS)), commercially available from Kodak and equipped with a 830 nm IR laser diode, at energy densities between 50 and 200 mJ/cm2. Printing plates PP-13 to PP-15 were obtained.

3. ΔE Measurement

See Example 1

4. Results

Total Colour Difference ΔE

The total colour difference ΔE was measured and the results are summarized in the Table 13 below.

A total colour difference ΔE above or equal to 2 is defined as a clear print out image. A total colour difference ΔE below 2 is defined as an unsufficient print out image.

TABLE 13

Results of the total colour difference ΔE

| Printing Plate | Photo-polymer layer | Overcoat layer | Exposure energy (mJ/cm²) | ΔE |
|---|---|---|---|---|
| PP-13 inventive | PL-03 | OC-13 | 120 | 5.3 |
| PP-14 comparative | PL-04 | OC-14 | 120 | 1.7 |
| PP-15 comparative | PL-05 | OC-14 | 120 | 1.8 |

The results in Table 13 demonstrate that the print-out image is strong (the total colour difference ΔE is equal or higher than 2) for the inventive printing plate including an overcoat layer including the dye according to the present invention. Comparative printing plates PP-14 and PP-15 show a weak print-out image (the total colour difference ΔE is lower than 2). Comparative printing plates PP-14 and PP-15 include no IR compound according to the present invention in the overcoat layer. Printing plate PP-14 includes a leuco dye of the prior art in the photosensitive layer and PP-15 includes the thermochromic IR dye in the photosensitive layer. Both plates result in a poor print-out image.

5. Stability of the Print-Out Image

The stability of the print-out image was evaluated by determining the total colour difference ΔE before and after exposing a printing plate to regular white office light (800 lux). As a reference, the total colour difference ΔE was also determined of a printing plate which was stored in a bag protected from external light.

The total colour difference ΔE of the printing plates was measured immediately after the exposure step (see below). Subsequently, the printing plates were exposed to regular white office light (800 lux) as well as stored in a bag protected from external light for one hour. The ΔE was re-measured after one hour and the obtained results are summarized in Table 14 below.

The total colour difference ΔE was measured immediately after exposure to regular white office light (800 lux) and after a time period of one hour.

The total colour difference ΔE of the printing plates was measured immediately after the exposure step. Subsequently, the printing plates were exposed to regular white office light (800 lux) as well as stored in a bag protected from external light for one hour. The ΔE was re-measured after one hour and the obtained results are summarized in Table 14.

TABLE 14

Effect of light exposure to the print-out image

| | Total colour difference ΔE * | | |
|---|---|---|---|
| Printing Plate | initial | One hour white light | One hour in a bag |
| PP-13 inventive | 5.3 | 4.1 | 5.0 |
| PP-14 comparative | 1.7 | <2 | <12 |

* See Examples 1 and 2

The results clearly demonstrate the excellent stability of the print-out image obtained for the inventive printing plate including the IR dye according to the present invention in the protective overcoat layer. The total colour difference ΔE remains high, even after exposure to office light and/or storage in a bag for one hour.

The print-out image of the comparative printing plate PP-14 is weak and fades away after storage of one hour. The total colour difference ΔE is low and decreases further after storage in a bag and/or after exposure to regular white office light (800 lux).

The invention claimed is:

1. A lithographic printing plate precursor comprising a support and a coating comprising (i) a photopolymerisable layer comprising a polymerisable compound and a photoinitiator, and (ii) a toplayer above the photopolymerisable layer;

wherein the toplayer has a thickness between 0.1 g/m² and 0.552 g/m² and comprises an infrared absorbing compound comprising a thermocleavable group which, upon exposure to heat and/or IR radiation, transforms into an electron-donor group such that the infrared absorbing compound undergoes a hypsochromic shift, and the infrared absorbing compound forms a print-out image upon exposure to IR radiation between 10 mJ/cm² and 150 mJ/cm².

2. The printing plate precursor of claim 1, wherein the coating is capable of being developed on-press with dampening liquid and/or ink.

3. The printing plate precursor of claim 1, wherein the print-out image is characterized by a CIE 1976 colour distance ΔE of at least 2.

4. The printing plate precursor of claim 1, wherein the infrared absorbing compound is an infrared absorbing dye which has a main absorption in the infrared wavelength range of the electromagnetic spectrum before exposure to heat and/or IR radiation, and the infrared absorbing dye absorbs more light in the visible wavelength range of the electromagnetic spectrum after exposure to heat and/or IR radiation.

5. The printing plate precursor of claim 4, wherein the infrared absorbing dye is of Formula I, II or III:

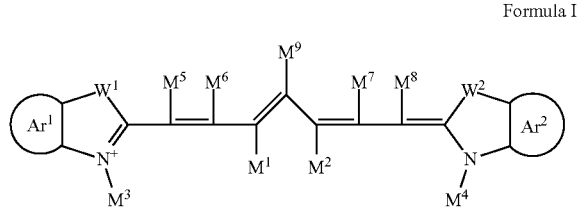

Formula I

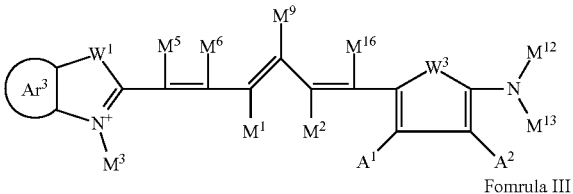

Formula II

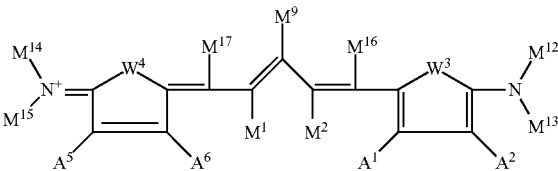

Formula III wherein $Ar^1$, $Ar^2$ and $Ar^3$ independently are an optionally substituted aromatic hydrocarbon group or an aromatic hydrocarbon group comprising an optionally substituted annulated benzene ring;

$W^1$ and $W^2$ independently are a sulphur atom, an oxygen atom, NR" wherein R" is an optionally substituted alkyl group, NH, a —$CM^{10}M^{11}$ group wherein $M^{10}$ and $M^{11}$ are independently an optionally substituted aliphatic hydrocarbon group or an optionally substituted (hetero) aryl group, or $M^{10}$ and $M^{11}$ together comprise the necessary atoms to form a cyclic structure;

$W^3$ is a sulphur atom or a —$C(A^3)=C(A^4)$-group;

$W^4$ is a sulphur atom or a —$C(A^7)=C(A')$-group;

$M^1$ and $M^2$ independently are hydrogen, an optionally substituted aliphatic hydrocarbon group, or together comprise the necessary atoms to form an optionally substituted cyclic structure which may comprise an optionally substituted annulated benzene ring;

$M^3$ and $M^4$ independently are an optionally substituted aliphatic hydrocarbon group;

$M^5$, $M^6$, $M^7$, $M^8$, $M^{16}$ and $M^{17}$ independently are hydrogen, a halogen, or an optionally substituted aliphatic hydrocarbon group;

$A^1$, $A^2$, $A^3$, $A^4$, $A^5$, $A^6$, $A^7$, and $A^8$ independently are hydrogen, a halogen atom, an optionally substituted aliphatic hydrocarbon group, an optionally substituted (hetero)aryl group, or $A^1$ and $A^2$, $A^3$ and $A^4$, $A^5$ and $A^6$, or $A^7$ and $A^8$ together comprise the necessary atoms to form a cyclic structure;

$M^{12}$, $M^{13}$, $M^{14}$, and $M^{15}$ independently are an optionally substituted aliphatic hydrocarbon group; an optionally substituted (hetero)aryl group; two of $M^{14}$, $M^{15}$, $A^5$, and $A^7$ together comprise the necessary atoms to form at least one cyclic structure; or two of $M^{12}$, $M^{13}$, $A^2$, and $A^4$ together comprise the necessary atoms to form at least one cyclic structure; and $M^9$ is a group which, upon exposure to heat and/or IR radiation, transforms into an electron-donor group such that an integrated light absorption of the dye between 350 to 750 nm increases;

wherein the dye optionally comprises one or more counter ions in order to obtain an electrically neutral compound.

6. The printing plate precursor of claim 5, wherein $M^1$ and $M^2$ together comprise the necessary atoms to form an optionally substituted 5- or 6-membered ring which may comprise an optionally substituted annulated benzene ring.

7. The printing plate precursor of claim 5, wherein the infrared absorbing dye is of Formula IV

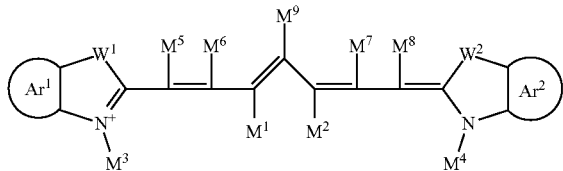

Formula IV wherein
$Ar^1$, $Ar^2$, $W^1$, $W^2$, $M^1$, $M^2$, $M^3$, $M^4$, $M^5$, $M^6$, $M^7$, $M^8$, and $M^9$ are as defined in claim 5 and wherein the dye optionally comprises one or more counter ions in order to obtain an electrically neutral compound.

8. The printing plate precursor of claim 5, wherein $M^9$ is $-(N=CR^{17})_a-NR^5-CO-R^4$, $-(N=CR^{17})_b-NR^5-SO_2-R^6$, $-(N=CR^{17})_c-NR^{11}-SO-R^{12}$, $-SO_2NR^{15}R^{16}$, or $-S-CH_2-CR^7(H)_{1-d}(R^8)_d-NR^9-COOR^{18}$;

wherein
a, b, c and d independently are 0 or 1;
$R^{17}$ is hydrogen, an optionally substituted aliphatic hydrocarbon group, an optionally substituted (hetero)aryl group, or $R^{17}$ and $R^5$ or $R^{17}$ and $R^{11}$ together comprise the necessary atoms to form a cyclic structure;
$R^4$ is $-OR^{10}$, $-NR^{13}R^{14}$, or $-CF_3$;
$R^{10}$ is an optionally substituted (hetero)aryl group or an optionally branched aliphatic hydrocarbon group;
$R^{13}$ and $R^{14}$ independently are hydrogen, an optionally substituted aliphatic hydrocarbon group, an optionally substituted (hetero)aryl group, or $R^{13}$ and $R^{14}$ together comprise the necessary atoms to form a cyclic structure;
$R^6$ is a optionally substituted aliphatic hydrocarbon group, an optionally substituted (hetero)aryl group, $-OR^{10}$, $-NR^{13}R^{14}$ or $-CF_3$;
$R^5$ is hydrogen, an optionally substituted aliphatic hydrocarbon group, $SO_3$, a $-COOR^{18}$ group, an optionally substituted (hetero)aryl group, or $R^5$ together with at least one of $R^{10}$, $R^{13}$, and $R^{14}$ comprise the necessary atoms to form a cyclic structure;
$R^{11}$, $R^{15}$ and $R^{16}$ independently are hydrogen, an optionally substituted aliphatic hydrocarbon group, or an optionally substituted (hetero)aryl group, or $R^{15}$ and $R^{16}$ together comprise the necessary atoms to form a cyclic structure;
$R^{12}$ is an optionally substituted aliphatic hydrocarbon group or an optionally substituted (hetero)aryl group;
$R^7$ and $R^9$ independently are hydrogen or an optionally substituted aliphatic hydrocarbon group;
$R^8$ is $-COO-$ or $-COOR^{8'}$, wherein $R^{8'}$ is hydrogen, an alkali metal cation, an ammonium ion, or a mono-, di-, tri-, or tetra-alkyl ammonium ion; and
$R^{18}$ is an optionally substituted (hetero)aryl group or an alpha-branched aliphatic hydrocarbon group.

9. The printing plate precursor of claim 5 wherein $M^9$ is $-NR^5-CO-R^4$ or $-NR^5-SO_2-R^6$ wherein
$R^4$ is $-OR^{10}$, wherein $R^{10}$ is an optionally branched aliphatic hydrocarbon group;

$R^5$ is hydrogen, an optionally substituted aliphatic hydrocarbon group, or an optionally substituted (hetero)aryl group; and
$R^6$ is an optionally substituted aliphatic hydrocarbon group or an optionally substituted (hetero)aryl group.

10. The printing plate precursor of claim 4 wherein the infrared absorbing dye is of Formula V, Formula VI, Formula VII, Formula VIII, Formula IX, Formula X, Formula XI, or Formula XII:

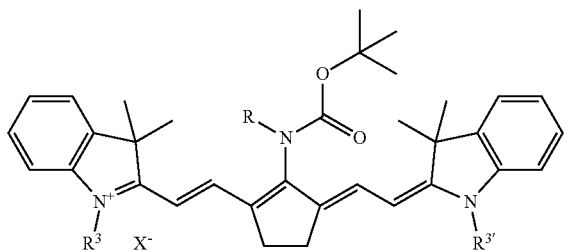

Formula V

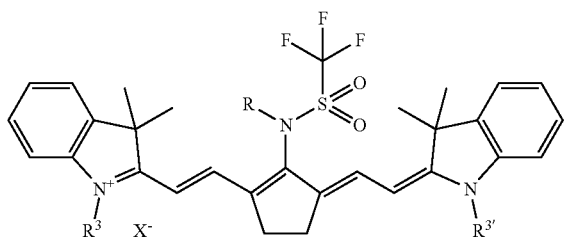

Formula VI

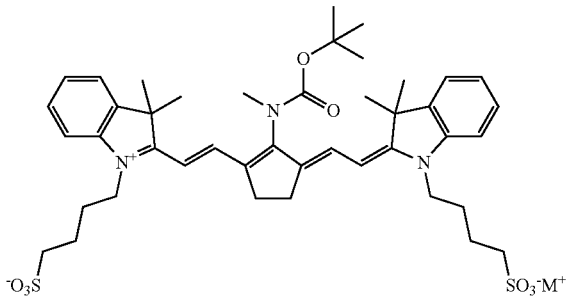

Formula VII

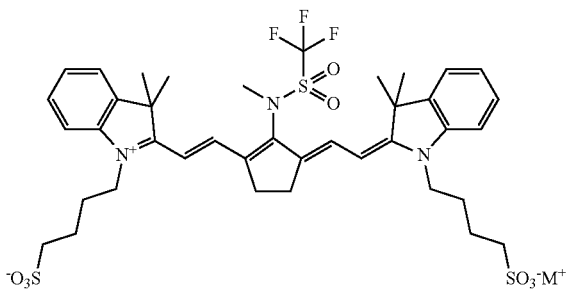

Formula VIII

Formula IX

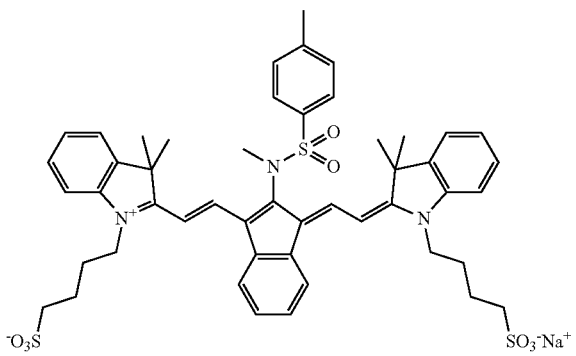

Formula X

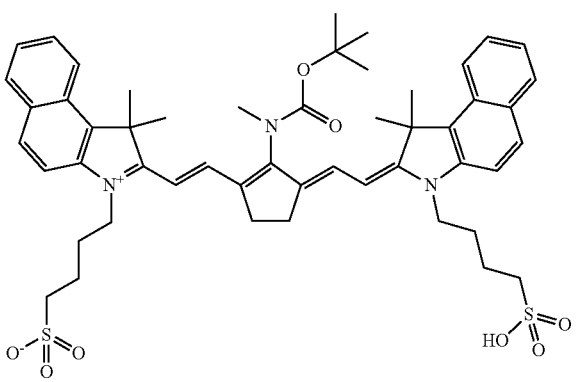

Formula XI

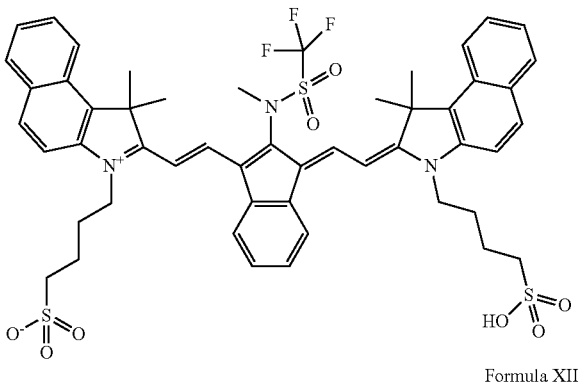

Formula XII

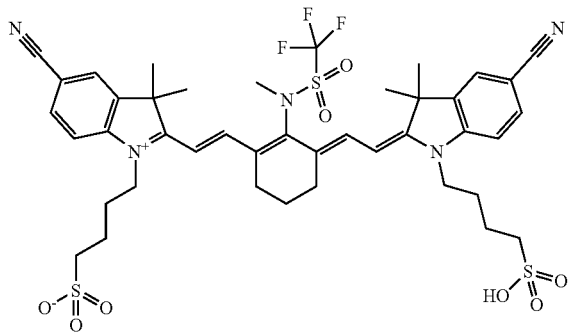

wherein
X⁻ is halogen, sulphonate, perfluorosulphonate, tosylate, tetrafluoroborate, hexafluorophosphate, arylborate or arylsulphonate;
R is hydrogen, an optionally substituted aliphatic hydrocarbon group, or an optionally substituted (hetero)aryl group;
$R^3$ and $R^{3'}$ are independently an optionally substituted alkyl group or an ether group; and
$M^+$ is $Li^+$, $Na^+$, $K^+$, $NH_4^+$, an optionally substituted aryl group, or $R'R''R'''NH^+$ wherein R', R'', and R''' independently are hydrogen or an optionally substituted alkyl group.

11. A method for making a printing plate precursor comprising the steps of:
    coating a support with:
    (i) a photopolymerisable layer comprising a polymerisable compound and a photoinitiator, and
    (ii) a toplayer above the photopolymerisable layer, wherein the toplayer has a thickness between 0.1 g/m² and 0.552 g/m² and comprises an infrared absorbing compound comprising a thermocleavable group which, upon exposure to heat and/or IR radiation, transforms into an electron-donor group such that the infrared absorbing compound undergoes a hypsochromic shift, and the infrared absorbing compound forms a print-out image upon exposure to IR radiation between 10 mJ/cm² and 150 mJ/cm², to provide a precursor, and
    drying the precursor.

12. A method for making a printing plate including the steps of:
    image-wise exposing a lithographic printing plate precursor to heat and/or IR radiation to form a lithographic image comprising image areas and non-image areas and to induce a colour change in the image areas; and
    developing the exposed precursor,
    wherein the lithographic printing plate precursor comprises a support and a coating comprising (i) a photopolymerisable layer comprising a polymerisable compound and a photoinitiator, and (ii) a toplayer above the photopolymerisable layer, wherein the toplayer has a thickness between 0.1 g/m² and 0.552 g/m² and comprises an infrared absorbing compound comprising a thermocleavable group which, upon exposure to heat and/or IR radiation, transforms into an electron-donor group such that the infrared absorbing compound undergoes a hypsochromic shift, and the infrared absorbing compound forms a print-out image upon exposure to IR radiation between 10 mJ/cm² and 150 mJ/cm².

13. The method of claim 12, wherein the colour change is characterized by a CIE 1976 colour distance ΔE between the image areas and non-image areas of at least 2.

14. The method of claim 12, wherein the printing plate precursor is exposed to IR radiation and the IR radiation has an energy density between 75 mJ/cm² and 150 mJ/cm².

15. The method of claim 12, wherein the precursor is developed by mounting the precursor on a plate cylinder of a lithographic printing press and rotating the plate cylinder while feeding dampening liquid and/or ink to the precursor.

* * * * *